(12) United States Patent
Takayama et al.

(10) Patent No.: US 7,893,439 B2
(45) Date of Patent: Feb. 22, 2011

(54) SILICON NITRIDE FILM AND SEMICONDUCTOR DEVICE

(75) Inventors: Toru Takayama, Atsugi (JP); Shunpei Yamazaki, Setagaya (JP); Kengo Akimoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 180 days.

(21) Appl. No.: 12/003,984

(22) Filed: Jan. 4, 2008

(65) Prior Publication Data

US 2008/0142887 A1 Jun. 19, 2008

Related U.S. Application Data

(62) Division of application No. 11/017,870, filed on Dec. 22, 2004, now Pat. No. 7,335,918, which is a division of application No. 10/439,295, filed on May 16, 2003, now Pat. No. 6,838,397.

(30) Foreign Application Priority Data

| May 17, 2002 | (JP) | ............................. 2002-143899 |
| May 31, 2002 | (JP) | ............................. 2002-160848 |

(51) Int. Cl.
- *H01L 29/04* (2006.01)
- *H01L 31/036* (2006.01)
- *H01L 23/48* (2006.01)

(52) U.S. Cl. ........................ 257/72; 257/59; 257/630; 257/760; 257/E21.625

(58) Field of Classification Search .................. 257/59, 257/72, 410, 411, 632, 760, E21.413, E21.625, 257/E21.639, E27.111
See application file for complete search history.

(56) References Cited

U.S. PATENT DOCUMENTS

| 3,967,981 A | 7/1976 | Yamazaki |
| 4,951,601 A | 8/1990 | Maydan et al. |
| 5,043,299 A | 8/1991 | Chang et al. |
| 5,182,619 A | 1/1993 | Pfiester |

(Continued)

FOREIGN PATENT DOCUMENTS

EP 0 468 758 1/1992

(Continued)

*Primary Examiner*—Shouxiang Hu
(74) *Attorney, Agent, or Firm*—Eric J. Robinson; Robinson Intellectual Property Law Office, P.C.

(57) ABSTRACT

An object of the present invention is to apply an insulating film of cure and high quality that is suitably applicable as gate insulating film and protective film to a technique that the insulating film is formed on the glass substrate under a temperature of strain point or lower, and to a semiconductor device realizing high efficiency and high reliability by using it. In a semiconductor device of the present invention, a gate insulating film of a field effect type transistor with channel length of from 0.35 to 2.5 µm in which a silicon nitride film is formed over a crystalline semiconductor film through a silicon oxide film, wherein the silicon nitride film contains hydrogen with the concentration of $1 \times 10^{21}/cm^3$ or less and has characteristic of an etching rate of 10 nm/min or less with respect to mixed solution containing an ammonium hydrogen fluoride ($NH_4HF_2$) of 7.13% and an ammonium fluoride ($NH_4F$) of 15.4%.

11 Claims, 21 Drawing Sheets

U.S. PATENT DOCUMENTS

| | | | |
|---|---|---|---|
| 5,286,296 A | | 2/1994 | Sato et al. |
| 5,306,651 A | * | 4/1994 | Masumo et al. ............. 438/166 |
| 5,310,410 A | | 5/1994 | Begin et al. |
| 5,324,360 A | | 6/1994 | Kozuka |
| 5,396,084 A | * | 3/1995 | Matsumoto ................... 257/72 |
| 5,587,520 A | | 12/1996 | Rhodes |
| 5,614,730 A | * | 3/1997 | Nakazawa et al. ............ 257/59 |
| 5,665,210 A | | 9/1997 | Yamazaki |
| 5,847,410 A | | 12/1998 | Nakajima |
| 5,888,858 A | | 3/1999 | Yamazaki et al. |
| 5,985,740 A | | 11/1999 | Yamazaki et al. |
| 6,063,654 A | | 5/2000 | Ohtani |
| 6,077,731 A | | 6/2000 | Yamazaki et al. |
| 6,093,934 A | | 7/2000 | Yamazaki et al. |
| 6,100,562 A | | 8/2000 | Yamazaki et al. |
| 6,144,057 A | | 11/2000 | Yamazaki |
| 6,177,302 B1 | | 1/2001 | Yamazaki et al. |
| 6,180,439 B1 | | 1/2001 | Yamazaki et al. |
| 6,225,152 B1 | | 5/2001 | Yamazaki et al. |
| 6,259,120 B1 | | 7/2001 | Zhang et al. |
| 6,261,877 B1 | | 7/2001 | Yamazaki et al. |
| 6,316,810 B1 | | 11/2001 | Yamazaki et al. |
| 6,323,142 B1 | | 11/2001 | Yamazaki et al. |
| 6,323,528 B1 | | 11/2001 | Yamazaki et al. |
| 6,329,229 B1 | | 12/2001 | Yamazaki et al. |
| 6,362,507 B1 | * | 3/2002 | Ogawa et al. ............. 257/350 |
| 6,365,510 B2 | | 4/2002 | Schmidbauer et al. |
| 6,465,287 B1 | | 10/2002 | Yamazaki et al. |
| 6,478,263 B1 | | 11/2002 | Yamazaki et al. |
| 6,492,659 B1 | | 12/2002 | Yamazaki et al. |
| 6,492,681 B2 | | 12/2002 | Koyama et al. |
| 6,498,369 B1 | | 12/2002 | Yamazaki et al. |
| 6,504,174 B1 | | 1/2003 | Yamazaki et al. |
| 6,528,358 B1 | | 3/2003 | Yamazaki et al. |
| 6,528,820 B1 | | 3/2003 | Yamazaki et al. |
| 6,541,315 B2 | | 4/2003 | Yamazaki et al. |
| 6,555,843 B1 | | 4/2003 | Yamazaki et al. |
| 6,599,818 B2 | | 7/2003 | Dairiki |
| 6,614,076 B2 | | 9/2003 | Kawasaki et al. |
| 6,620,658 B2 | | 9/2003 | Isobe et al. |
| 6,627,554 B1 | | 9/2003 | Komada |
| 6,639,265 B2 | | 10/2003 | Arao et al. |
| 6,653,657 B2 | | 11/2003 | Kawasaki et al. |
| 6,674,136 B1 | | 1/2004 | Ohtani |
| 6,744,069 B1 | | 6/2004 | Yamazaki et al. |
| 6,794,229 B2 | | 9/2004 | Asami et al. |
| 6,822,261 B2 | | 11/2004 | Yamazaki et al. |
| 6,838,397 B2 | | 1/2005 | Takayama et al. |
| 6,853,004 B2 | | 2/2005 | Ohtani |
| 6,872,658 B2 | | 3/2005 | Arakawa et al. |
| 6,893,887 B2 | | 5/2005 | Yamagata et al. |
| 7,037,811 B1 | | 5/2006 | Yamazaki et al. |
| 7,042,427 B2 | | 5/2006 | Inukai |
| 7,056,381 B1 | | 6/2006 | Yamazaki et al. |
| 7,078,727 B2 | | 7/2006 | Yamazaki et al. |
| 7,098,087 B2 | | 8/2006 | Akimoto et al. |
| 7,105,392 B2 | | 9/2006 | Isobe et al. |
| 7,135,741 B1 | | 11/2006 | Yamazaki et al. |
| 7,141,491 B2 | | 11/2006 | Yamazaki et al. |
| 7,148,092 B2 | | 12/2006 | Isobe et al. |
| 7,173,282 B2 | | 2/2007 | Yamazaki et al. |
| 7,220,613 B2 | | 5/2007 | Asami et al. |
| 7,264,979 B2 | | 9/2007 | Yamagata et al. |
| 7,335,570 B1 | | 2/2008 | Yamazaki |
| 7,422,630 B2 | | 9/2008 | Yamazaki et al. |
| 7,427,780 B2 | | 9/2008 | Yamazaki et al. |
| 7,456,056 B2 | | 11/2008 | Yamazaki et al. |
| 2001/0002703 A1 | * | 6/2001 | Koyama ...................... 257/40 |
| 2002/0001909 A1 | * | 1/2002 | Hasegawa ................... 438/303 |
| 2002/0043660 A1 | | 4/2002 | Yamazaki et al. |
| 2002/0043662 A1 | * | 4/2002 | Yamazaki et al. ............. 257/72 |
| 2002/0075423 A1 | * | 6/2002 | Fujino ........................ 349/43 |
| 2002/0121860 A1 | | 9/2002 | Seo et al. |
| 2003/0001158 A1 | | 1/2003 | Yamazaki et al. |
| 2003/0013280 A1 | | 1/2003 | Yamanaka |
| 2003/0098458 A1 | | 5/2003 | Yamazaki et al. |
| 2003/0209710 A1 | | 11/2003 | Yamazaki et al. |
| 2003/0218171 A1 | | 11/2003 | Isobe et al. |
| 2004/0077134 A1 | | 4/2004 | Takayama et al. |
| 2005/0164434 A1 | | 7/2005 | Arakawa et al. |
| 2006/0249730 A1 | | 11/2006 | Yamazaki et al. |
| 2006/0261341 A1 | | 11/2006 | Akimoto et al. |
| 2007/0254416 A1 | | 11/2007 | Asami et al. |

FOREIGN PATENT DOCUMENTS

| | | |
|---|---|---|
| EP | 1 033 755 | 9/2000 |
| JP | 03-016129 | 1/1991 |
| JP | 04-080928 | 3/1992 |
| JP | 04-130631 | 5/1992 |
| JP | 05-044017 | 2/1993 |
| JP | 07-056190 | 3/1995 |
| JP | 08-195494 | 7/1996 |
| JP | 08-242004 | 9/1996 |
| JP | 09-232250 | 9/1997 |
| JP | 09-312406 | 12/1997 |
| JP | 10-084085 | 3/1998 |
| JP | 11-251599 | 9/1999 |
| JP | 2000-315798 | 11/2000 |
| JP | 2001-203363 | 7/2001 |
| JP | 2001-261499 | 9/2001 |
| JP | 2002-050634 | 2/2002 |
| JP | 2002-057342 | 2/2002 |

* cited by examiner

FIG. 1
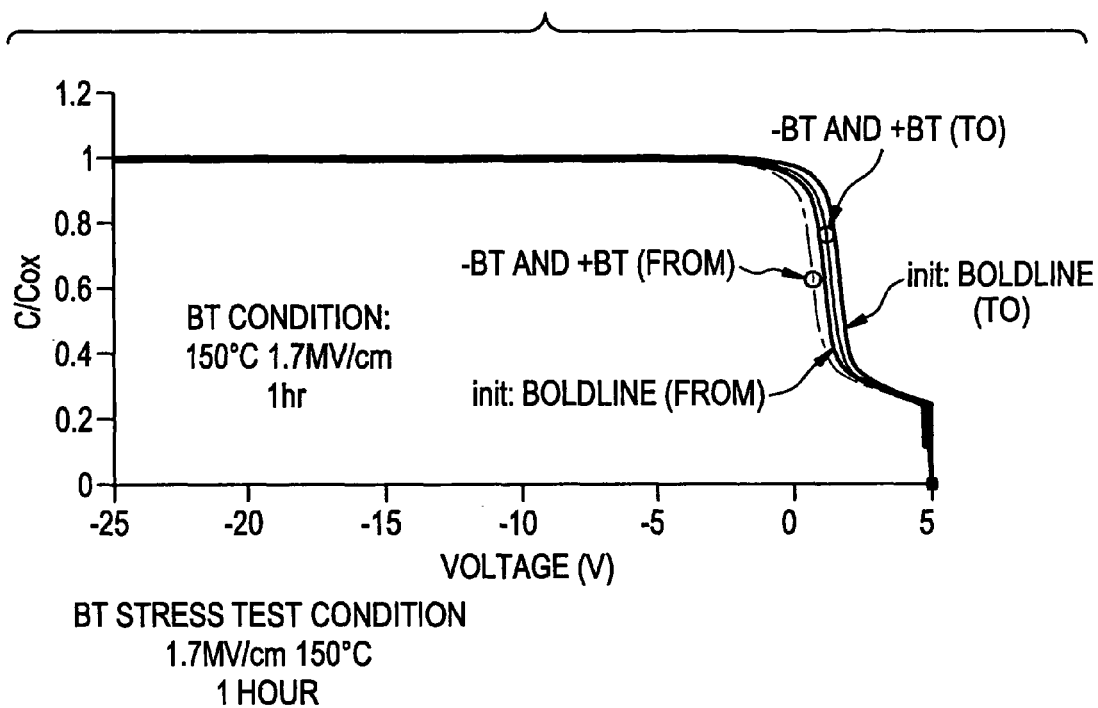
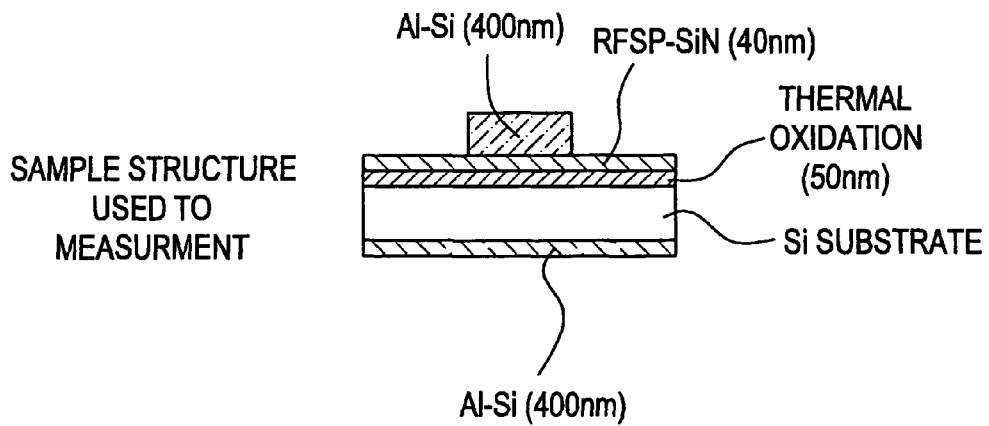

FIG. 2
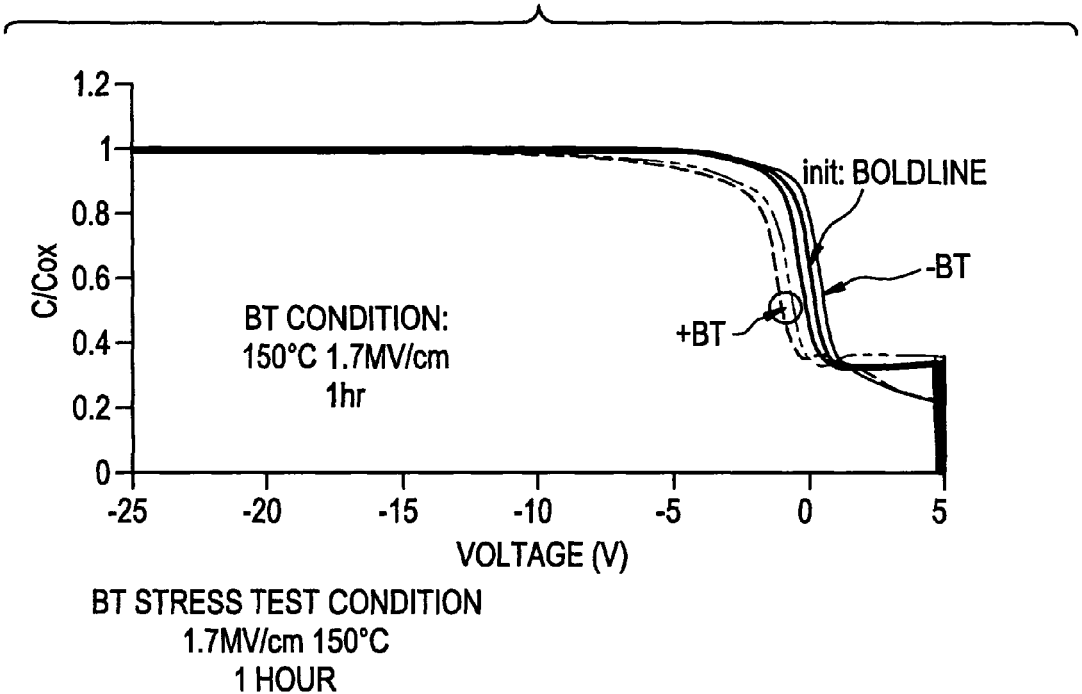
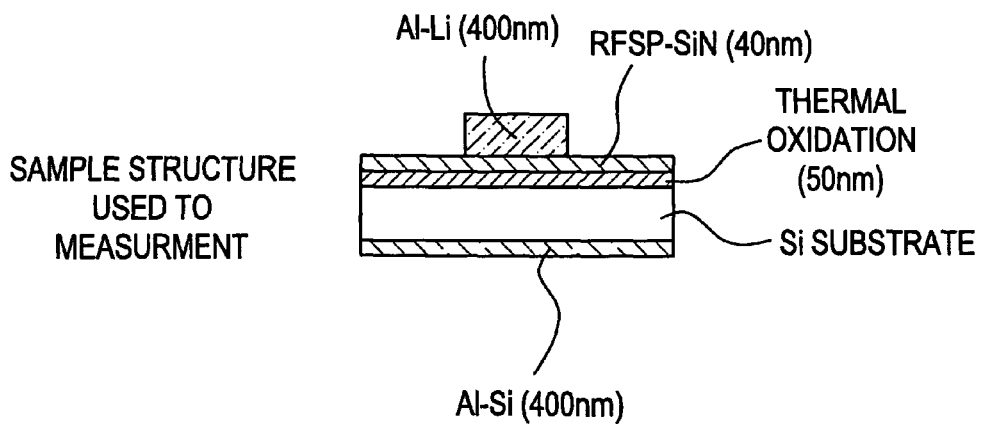

[FIG.3]
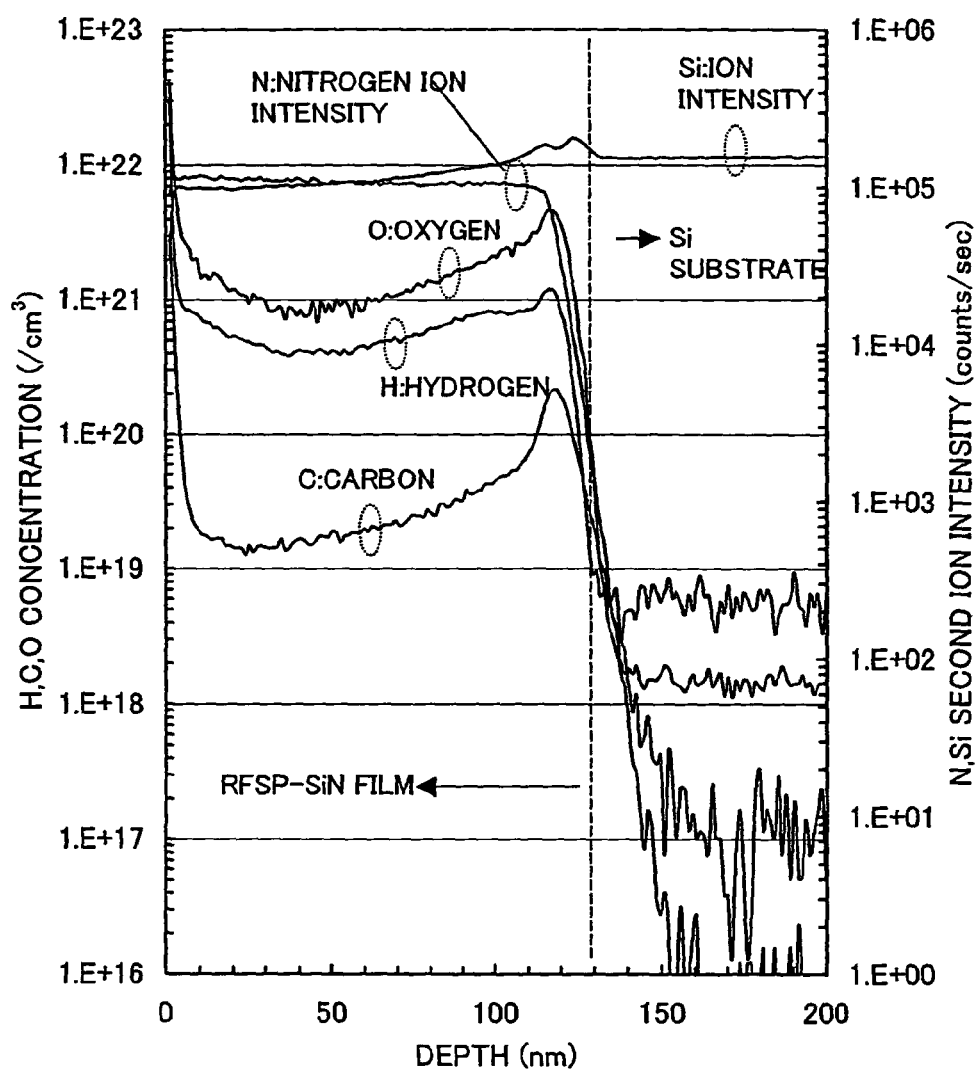
※SHOWN TO TABLE 1 ABOUT FORMING CONDITION OF RFSP−SiNFILM

[FIG.4]
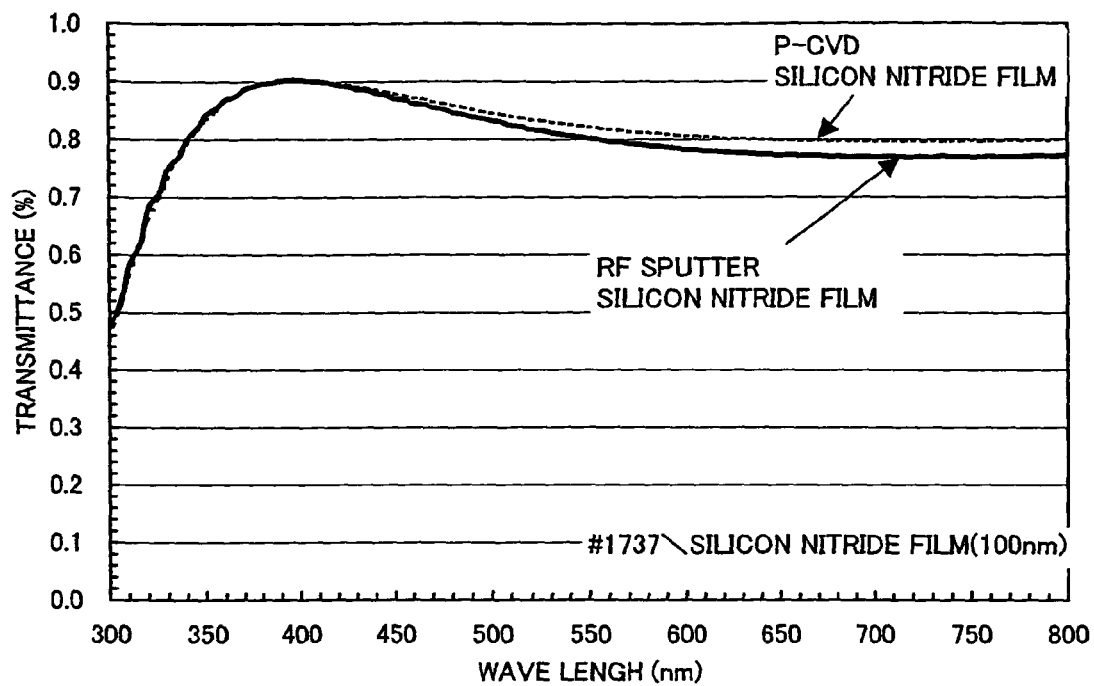

FIG. 5

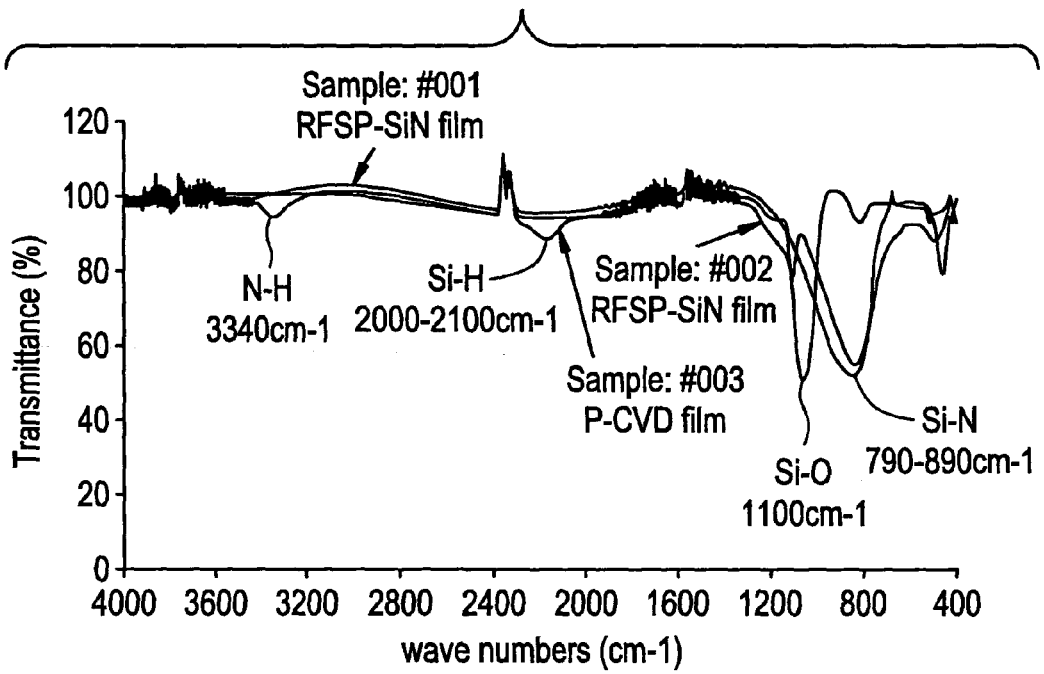

FILM FORMING CONDITION
sample: #001
substrate rotation: 5rpm
substrate temperature: R.T.
heated gas: none
film forming power: 800W (RF)
film forming pressure: 3.0mtorr
Ar/O2/N2=0/0/40sccm
film thickness: 500nm FILM FORMING CONDITION
sample: #002
substrate rotation: none
substrate temperature: 150°C
heated gas: O2=10sccm
film forming power: 3kW (RF)
film forming pressure: 0.4Pa
Ar/O2/N2=35/15/0sccm
film thickness: 500nm FILM FORMING CONDITION
sample: #003
substrate rotation: none
substrate temperature: 300°C
film forming power: 170W(RF)
film forming pressure: 1.2torr
SiH4/NH3/N2/H2
=30/240/300/60sccm
film thickness: 500nm

[FIG.6]
C-V characteristic in case of Li diffusion with MOS structure
Al-Si\Si SUBSTRATE\P-CVD-SiN(100nm)\Al-Li(400nm)
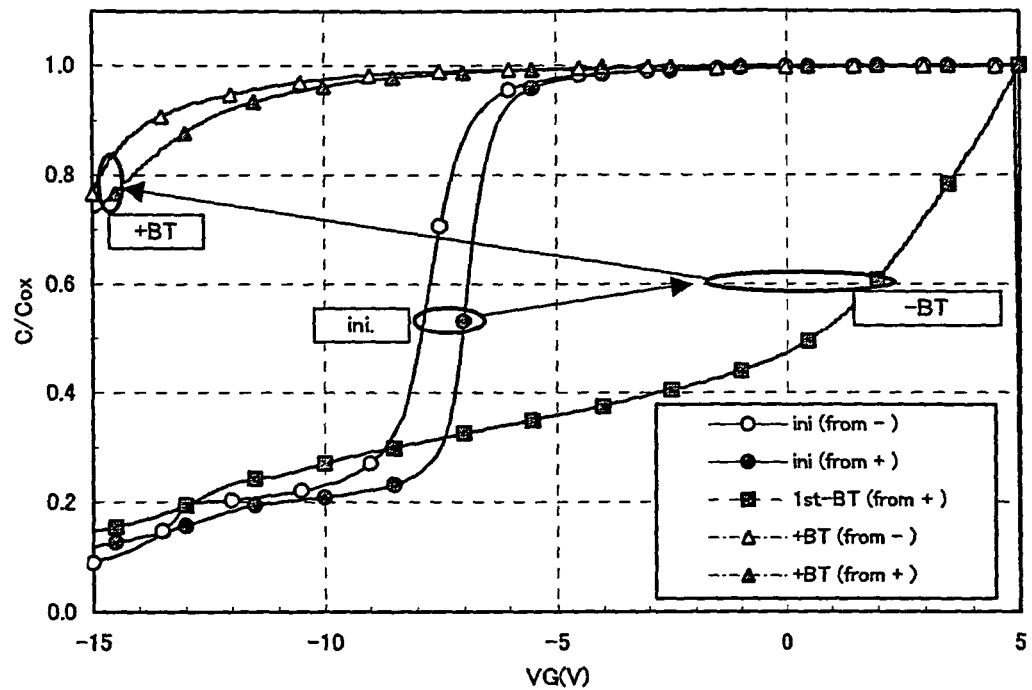
BT STRESS TEST CONDITION
1. 7MV/cm, 150°C
1HOUR

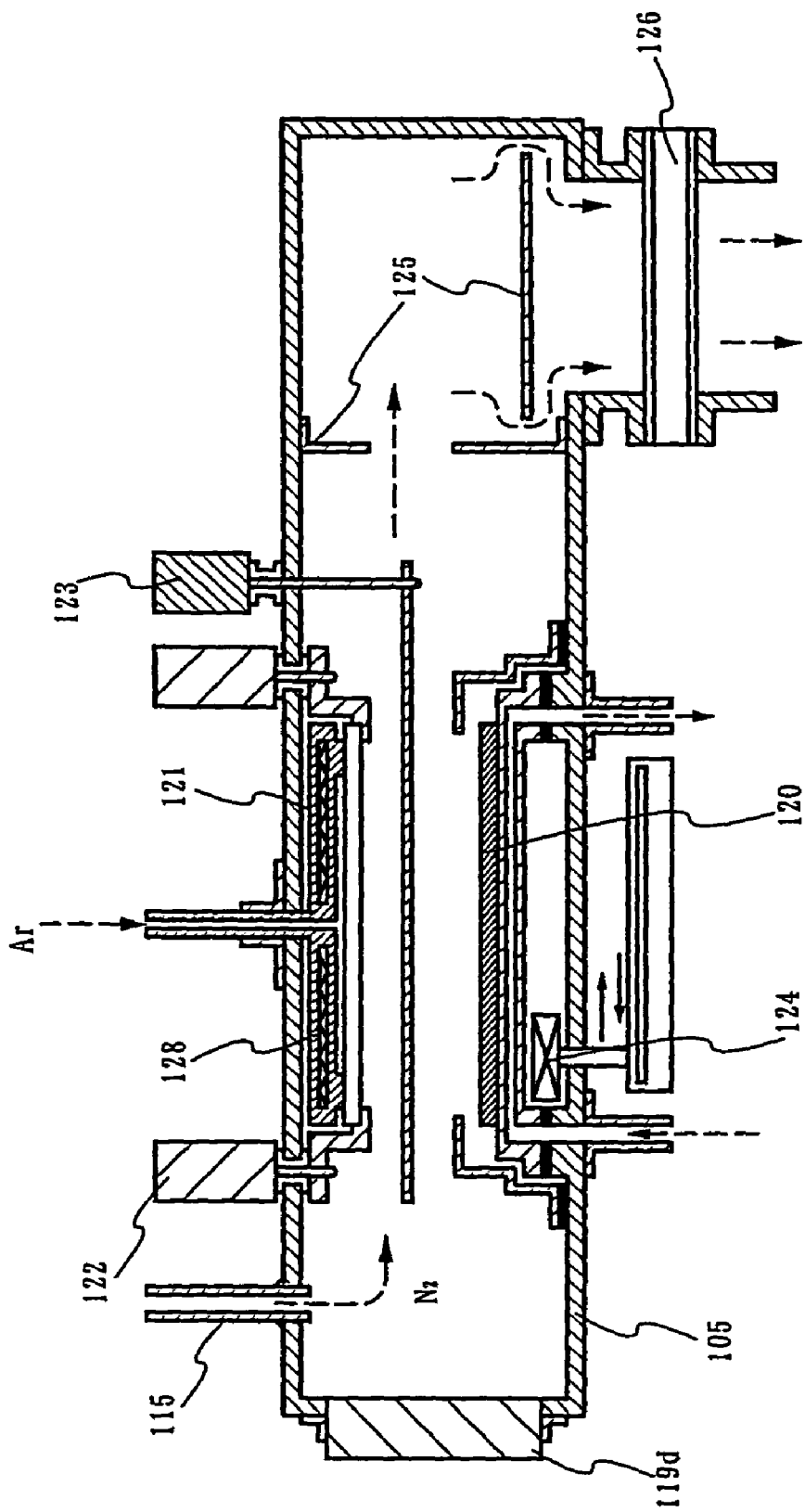

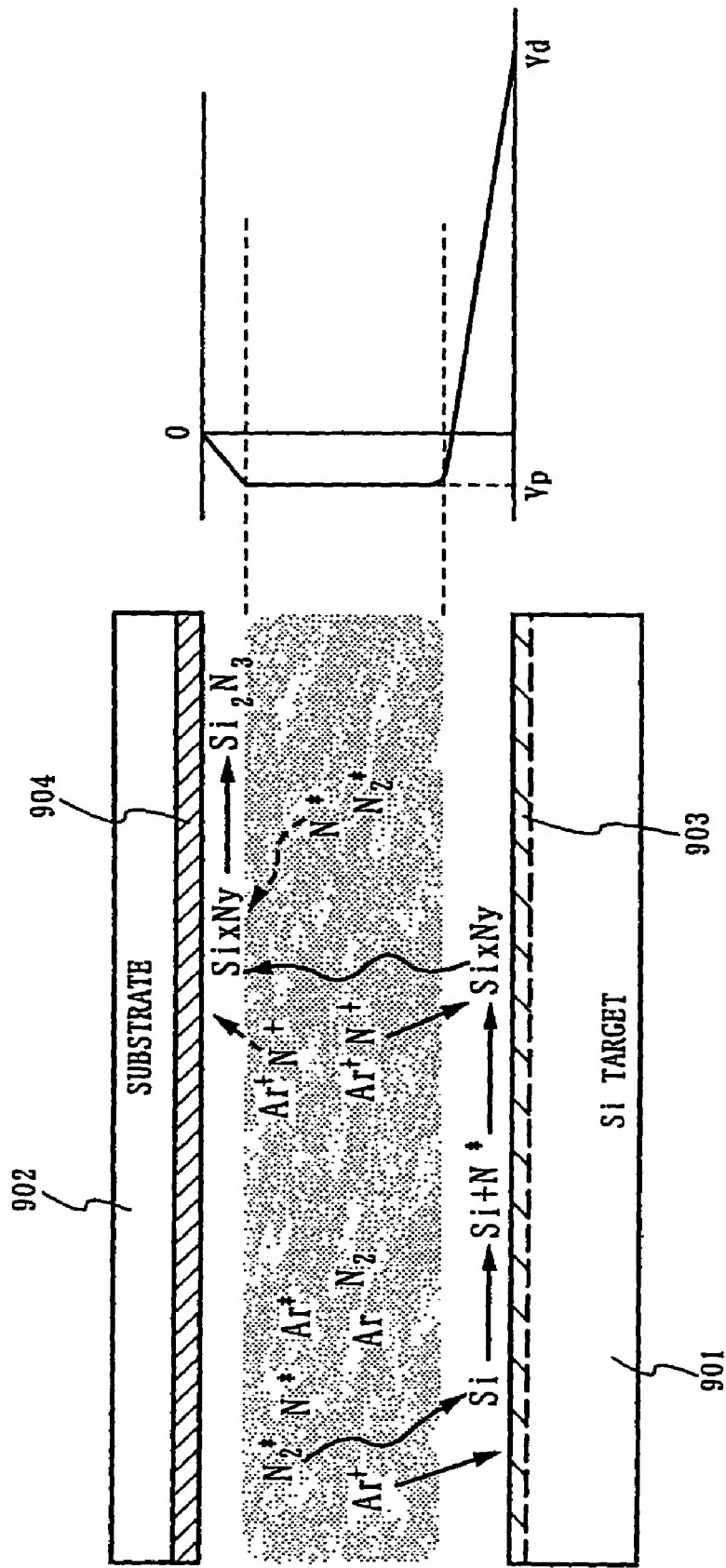
[FIG. 9]

[FIG. 10]
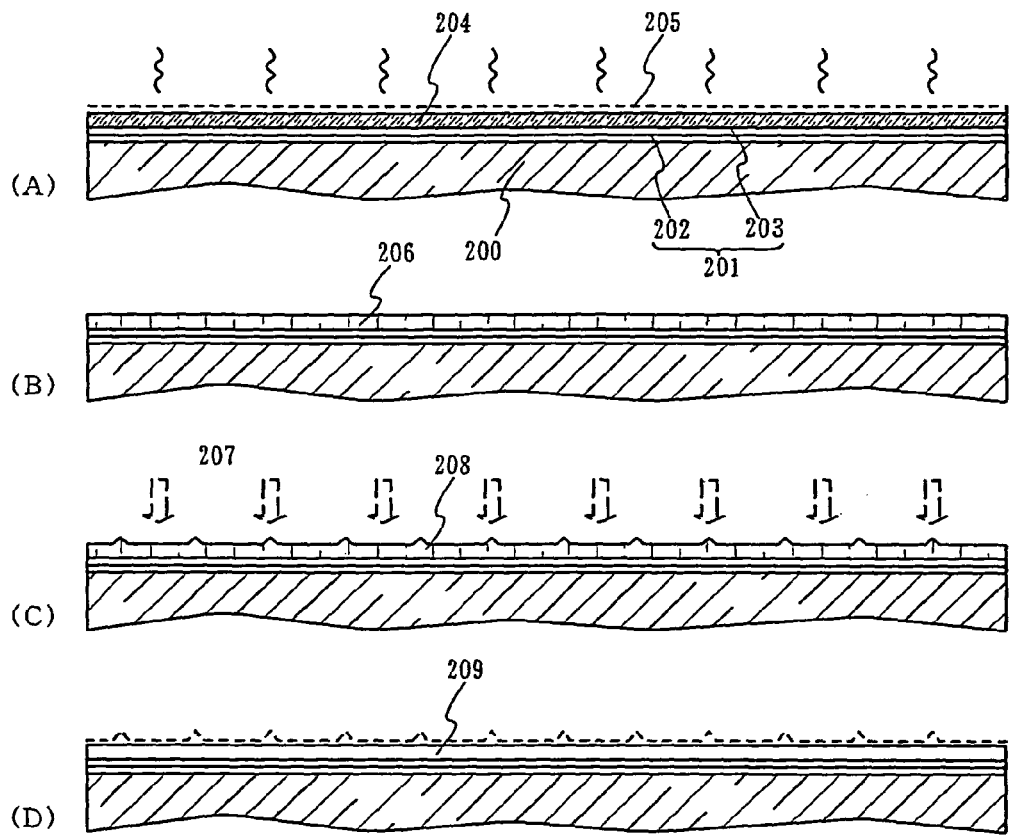
[FIG. 11]
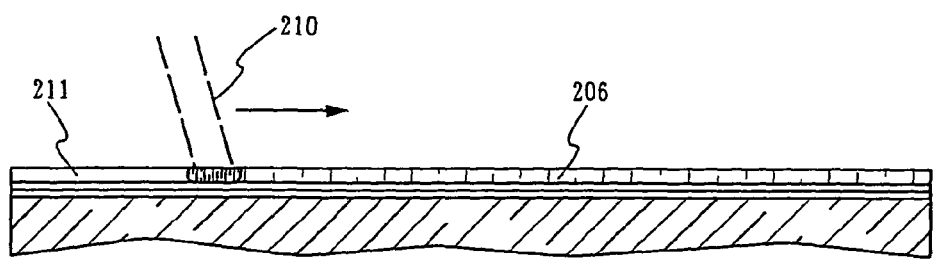

[FIG. 1 2]
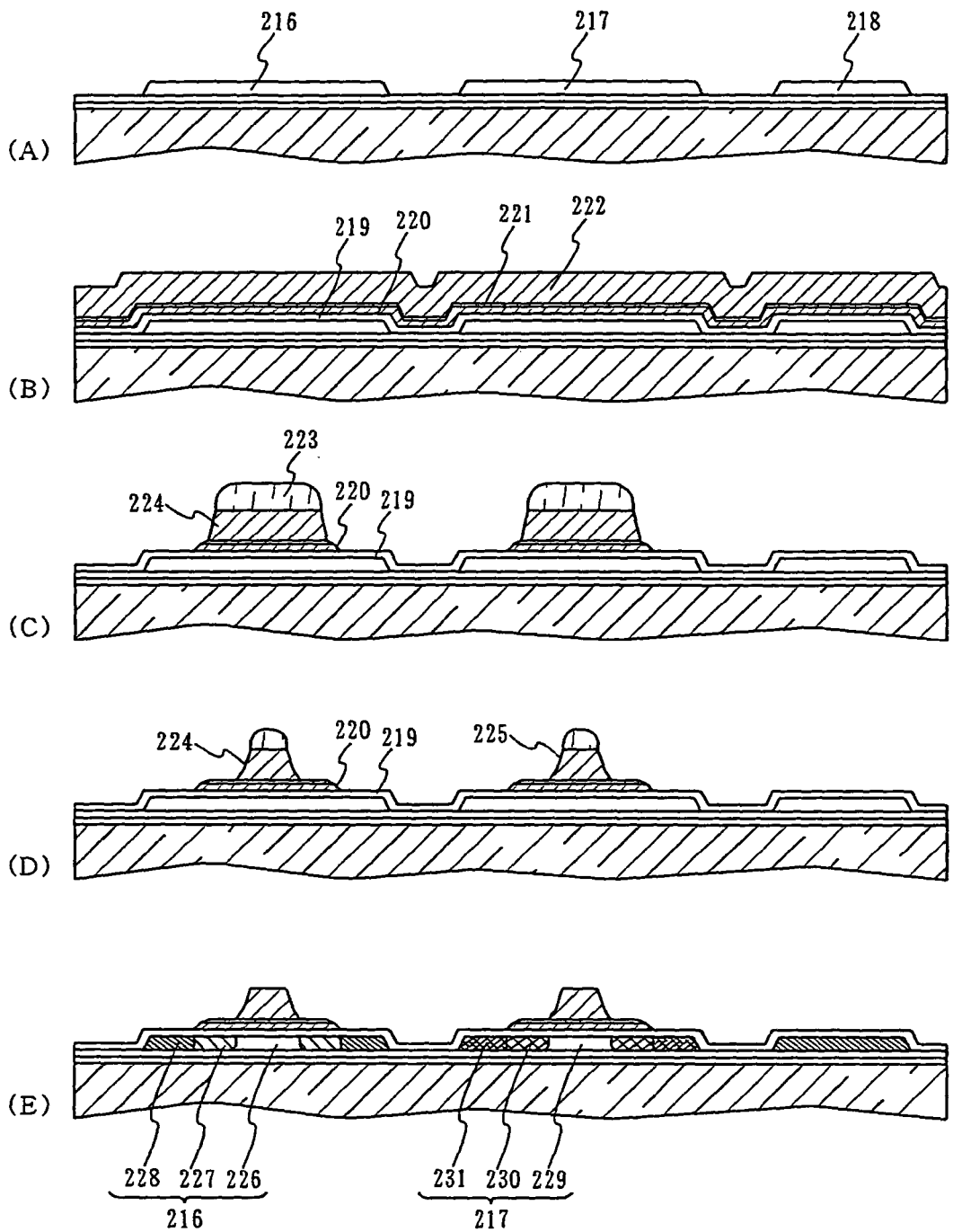

[FIG. 1 3]
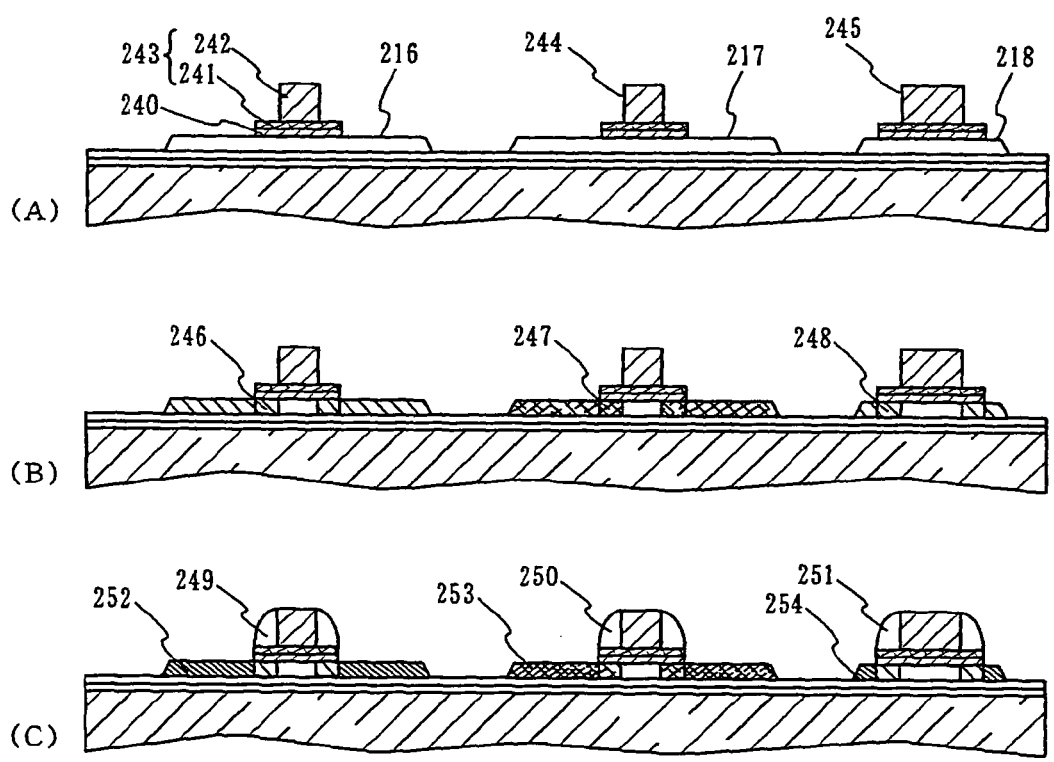

[FIG. 14]
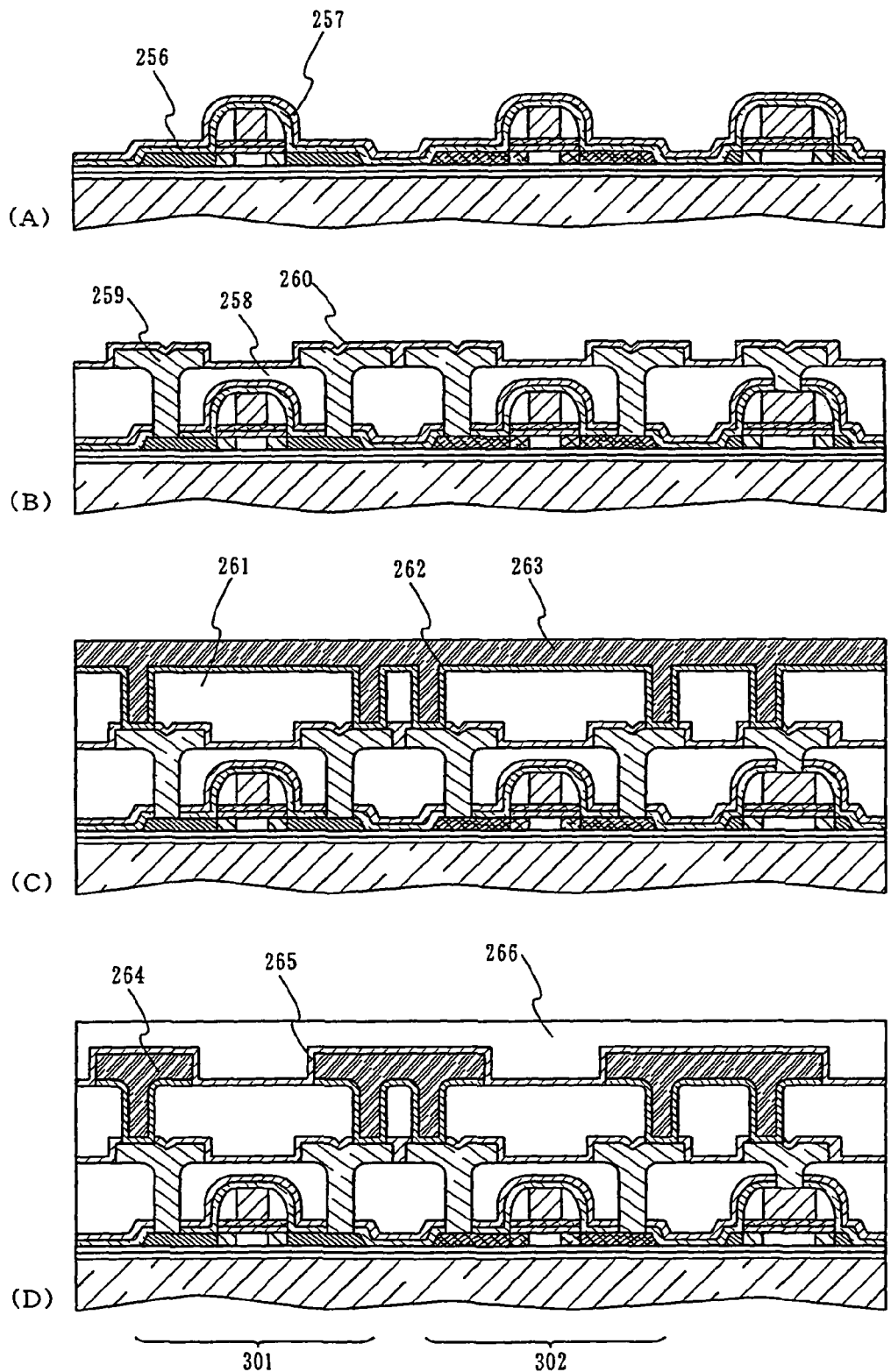

[FIG. 15]
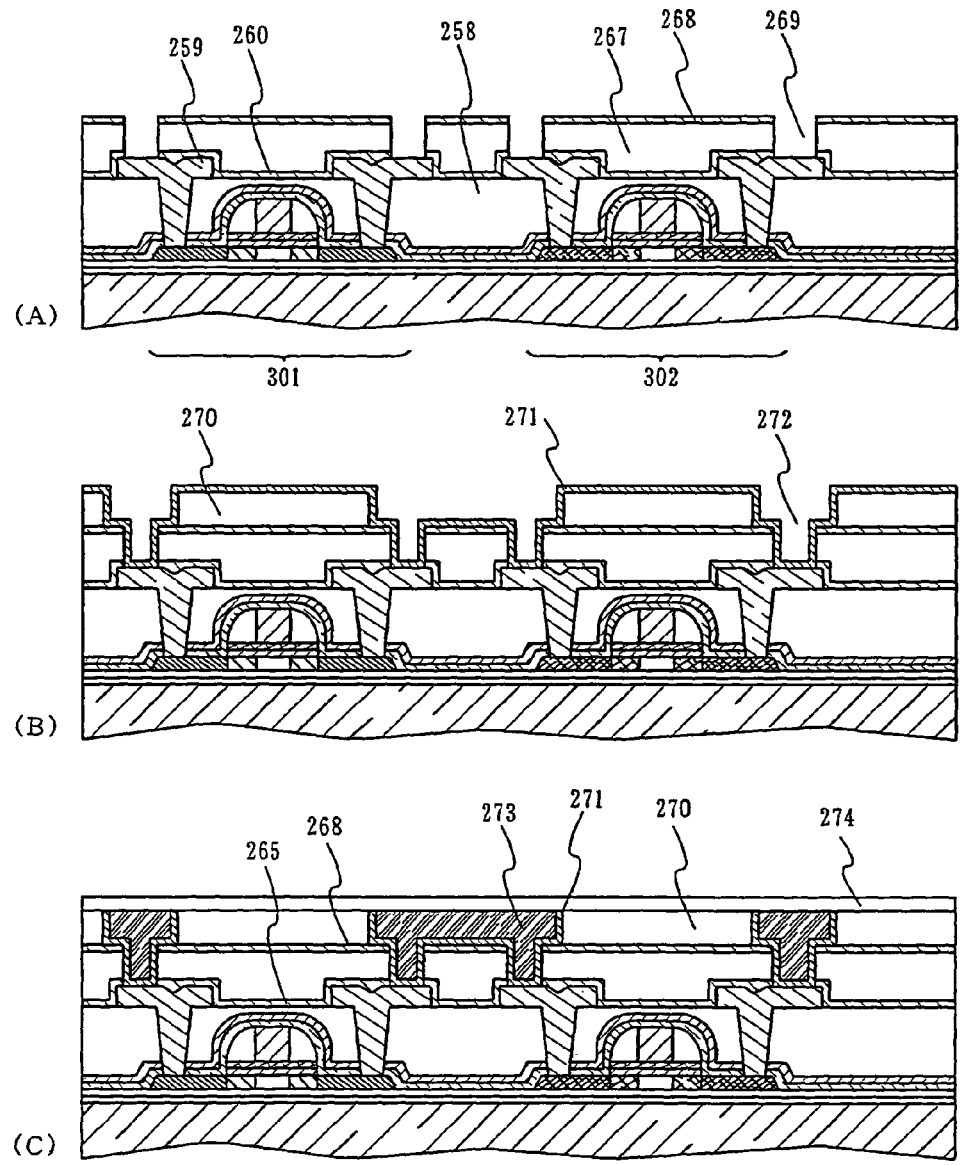

[FIG. 1 6]
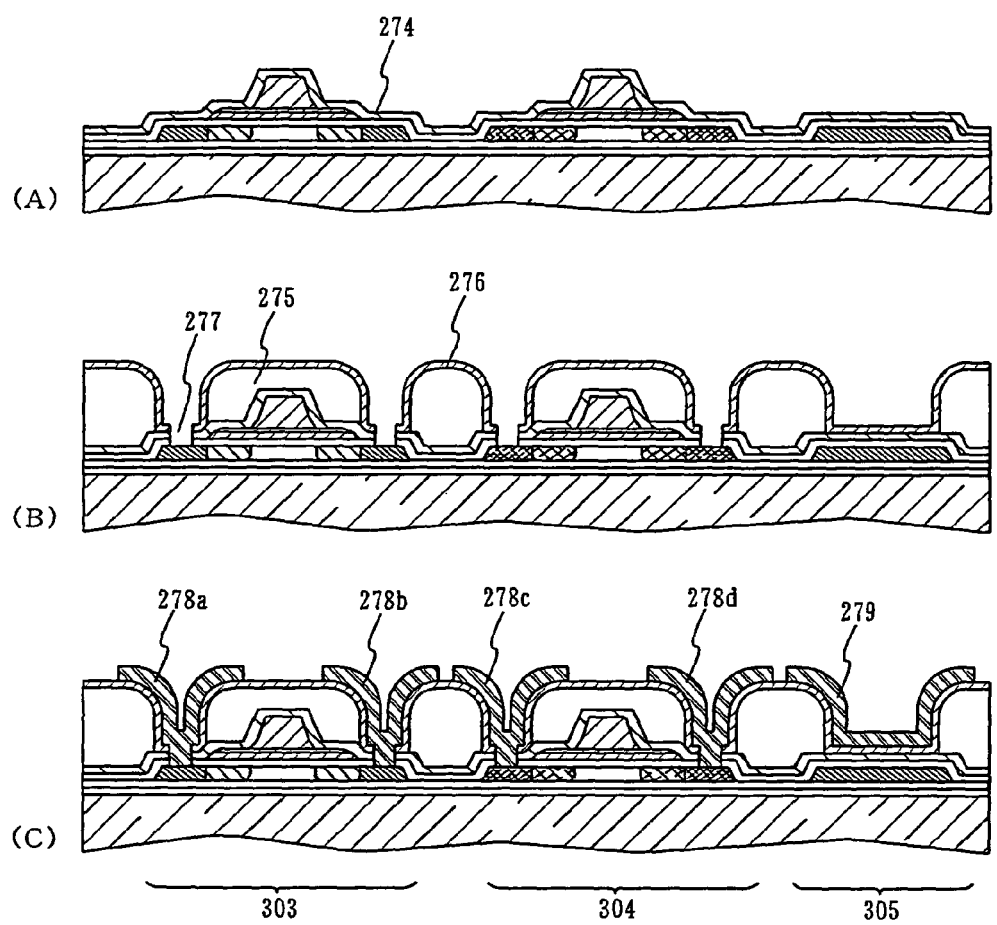

[Fig. 17]
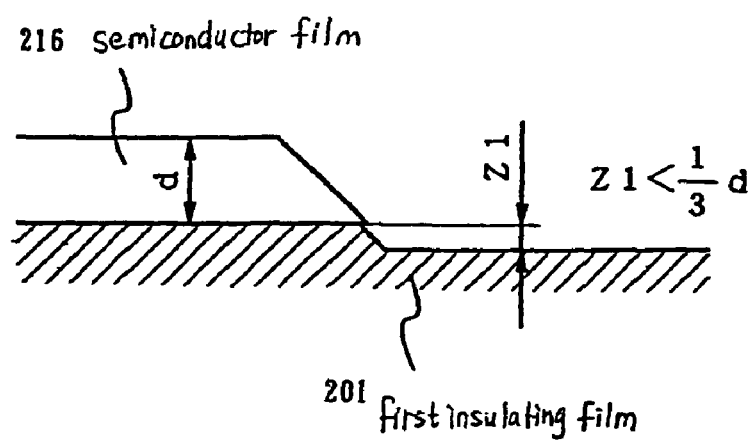

[FIG. 1 8]
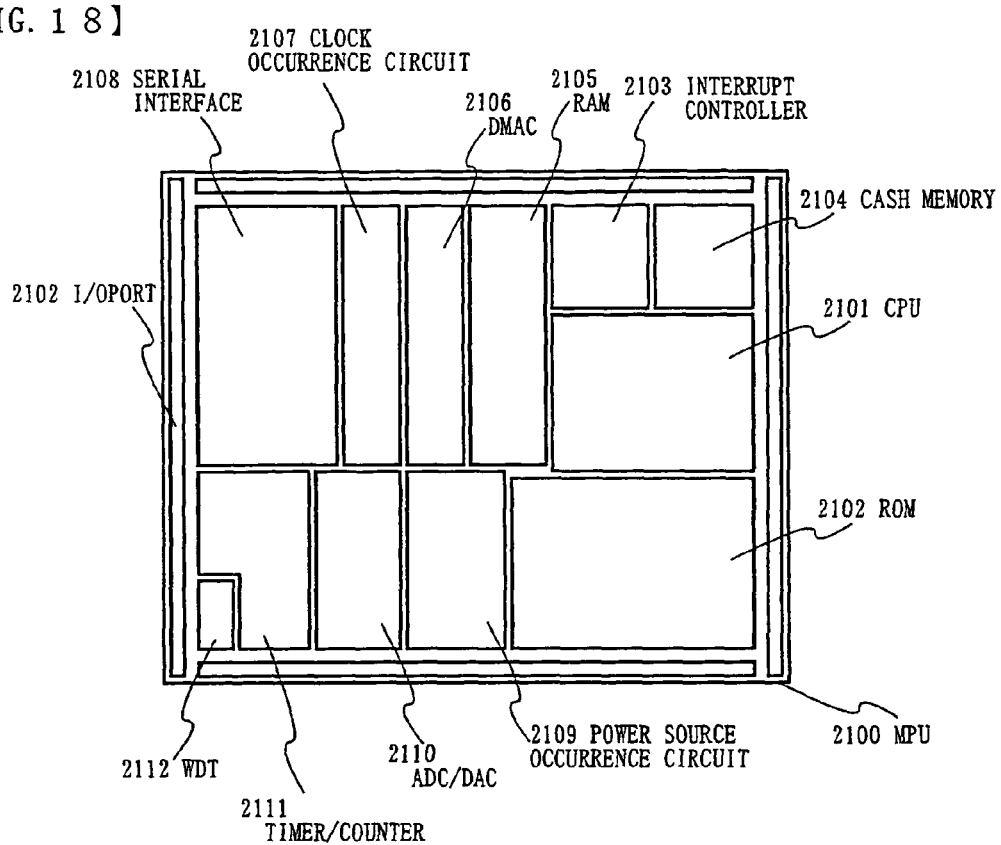
[FIG. 1 9]
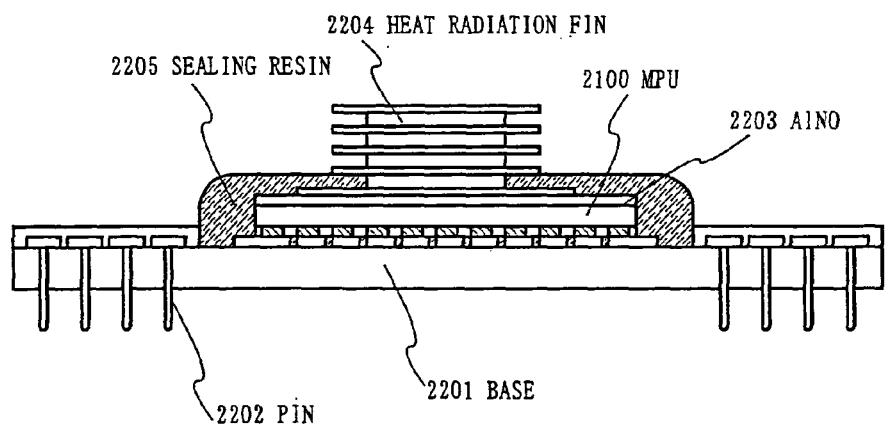

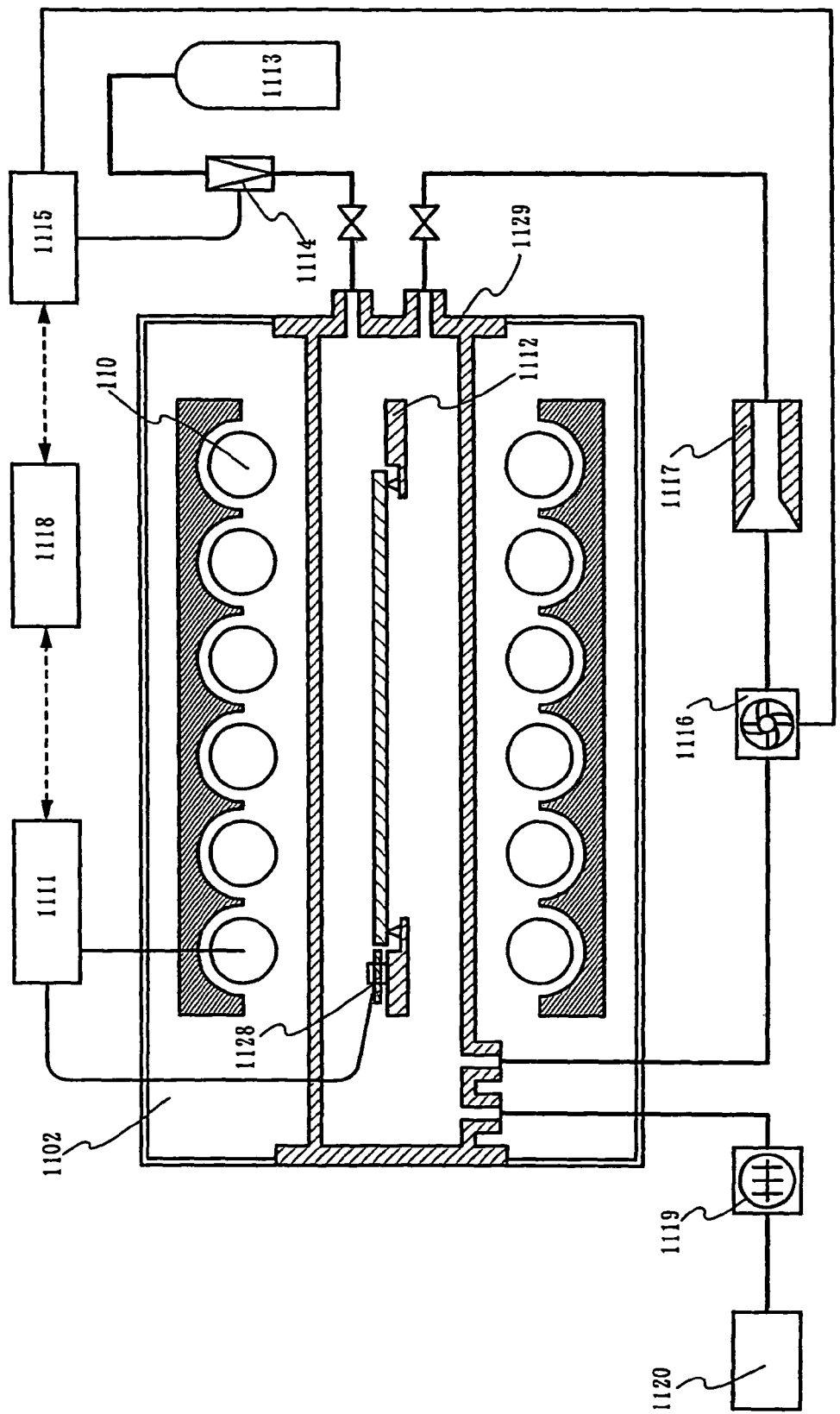
[FIG. 20]

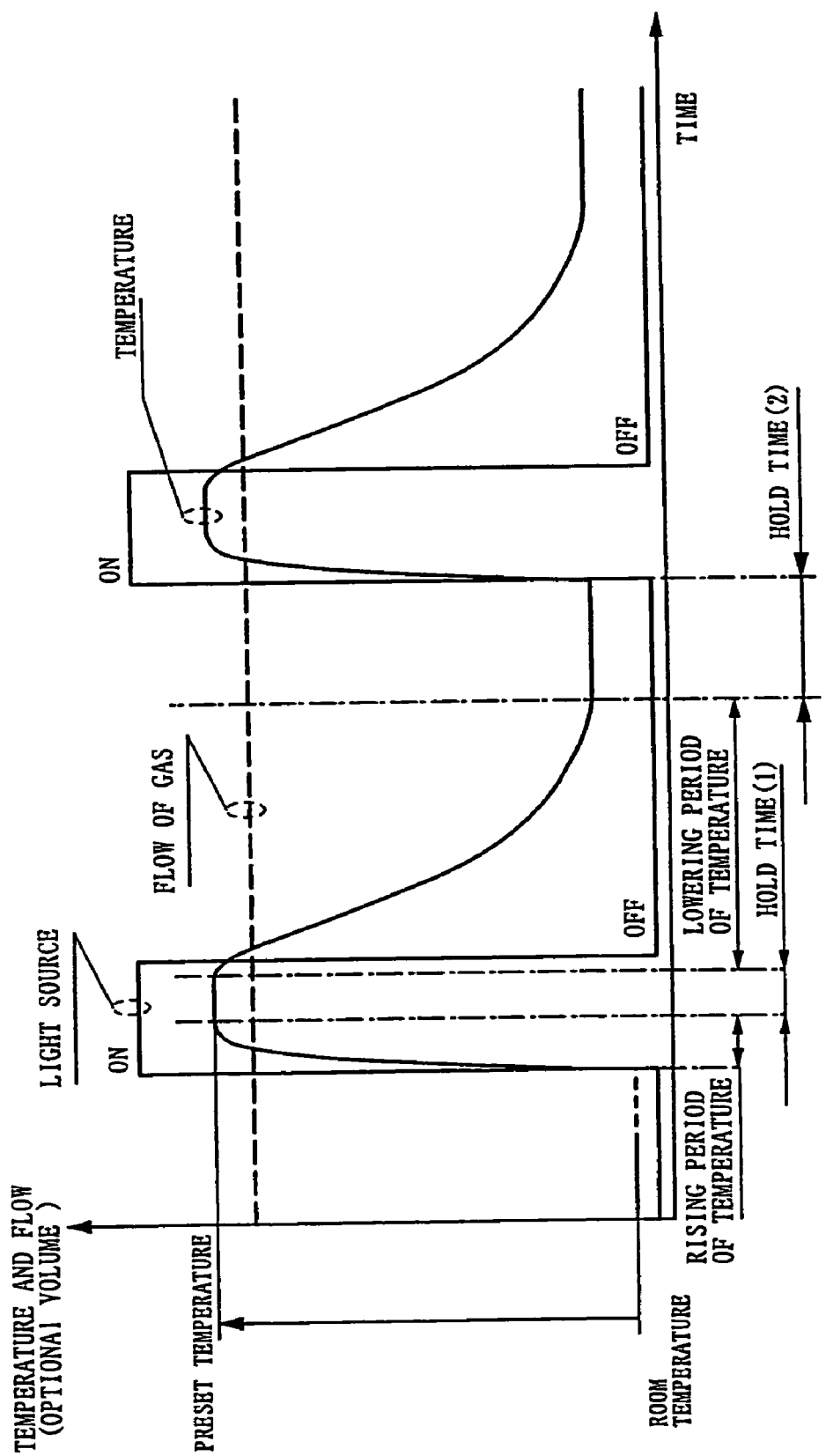
[FIG. 21]

[FIG. 22]
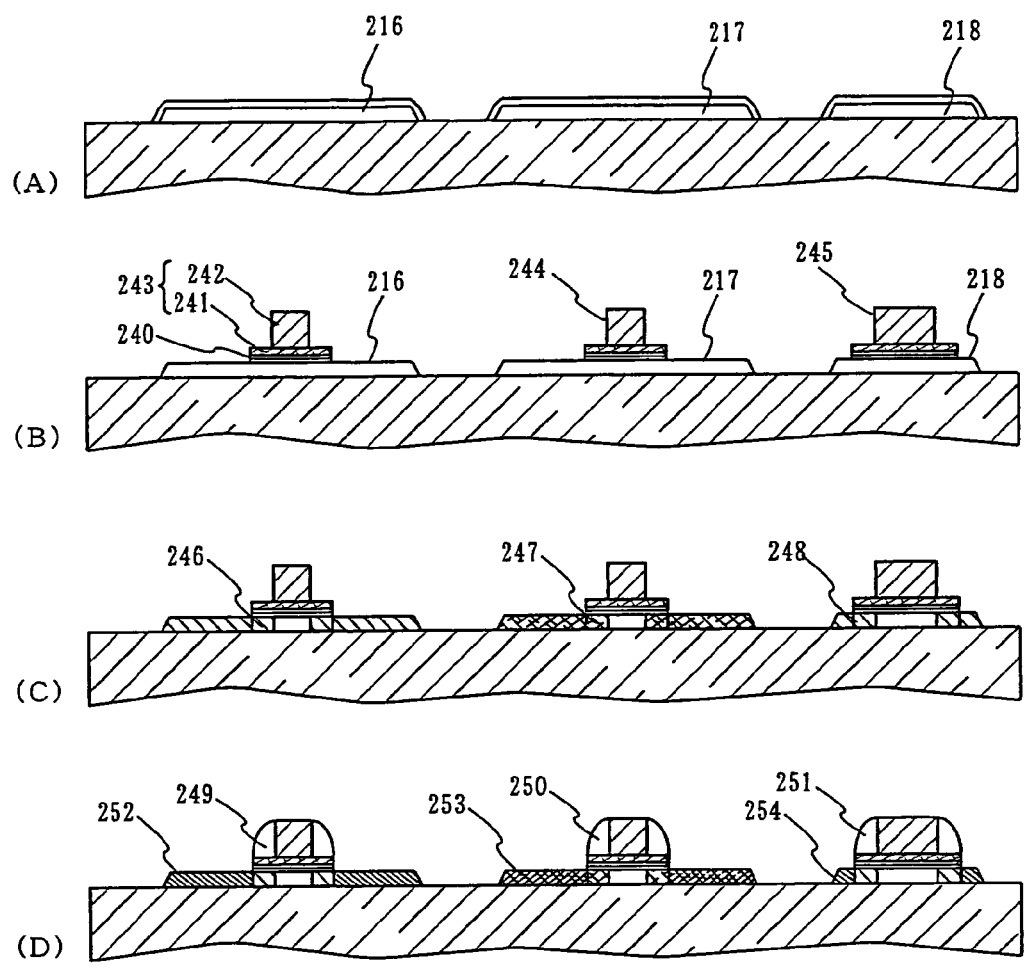

[FIG. 23]
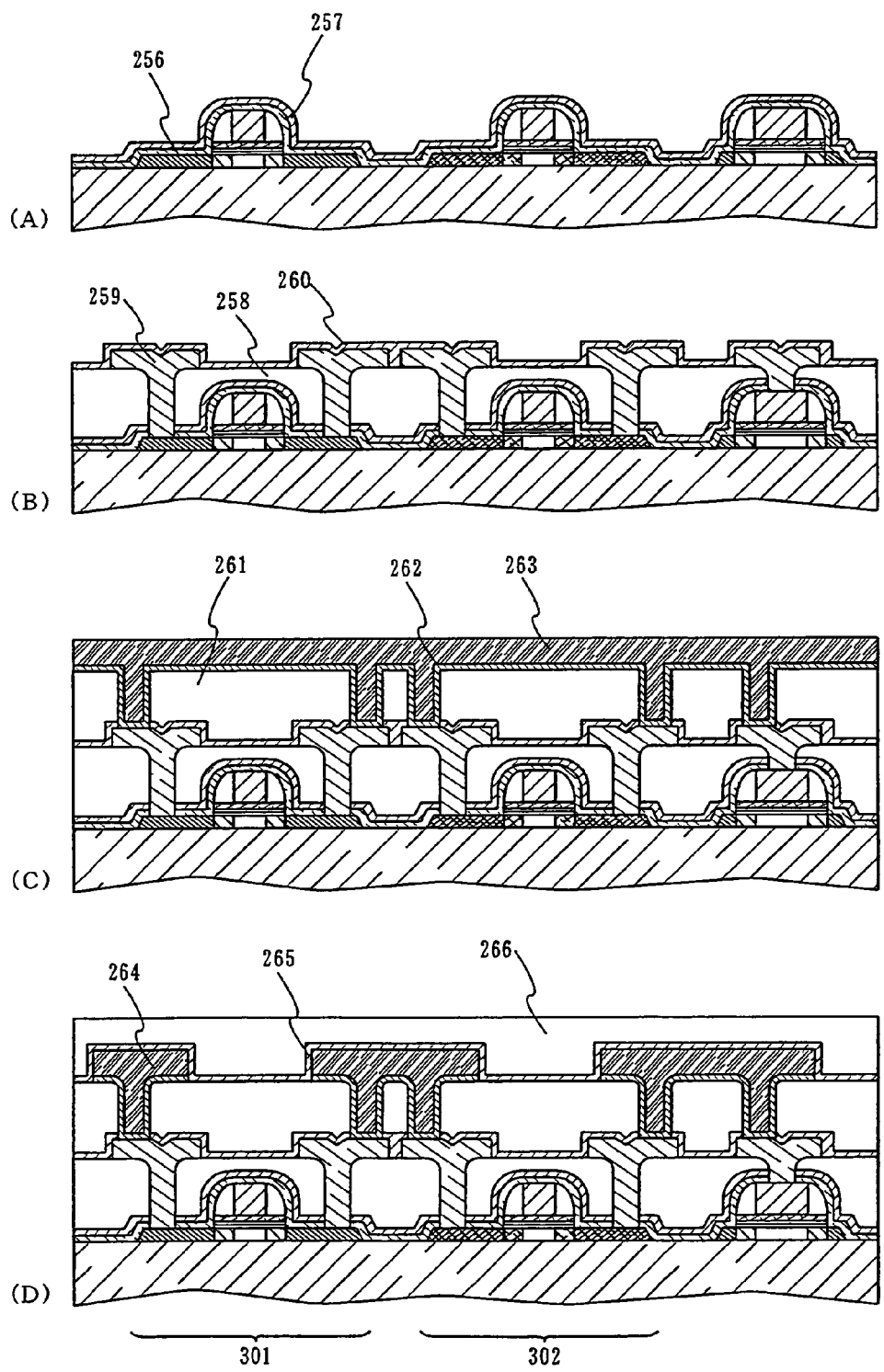

SILICON NITRIDE FILM AND SEMICONDUCTOR DEVICE

BACKGROUND OF THE INVENTION

The present invention relates to a silicon nitride film formed on a substrate with a strain point of 700° C. or less and to a semiconductor device containing a semiconductor element and semiconductor integrated circuit, typical example of field effect type transistor using the silicon nitride film.

In the display device using liquid crystals and electroluminescence (abbreviated to as EL), a technique has been developed that driving circuit is formed as one using the field effect type thin film transistor (abbreviated to as TFT) on the same glass substrate. In the TFT in order to realize practical operating frequency, a polycrystalline silicon film is used for active layer (semiconductor region that channel part is formed) that is its key component part. Furthermore, by realizing the additional high-speed operation, the concept of system on panel that the integrated circuit having various functions such as image processor and memory as well as microprocessor is realized through TFT is proposed.

Needless to say, not only the polycrystalline silicon film but also an insulating film is used in each region such as a gate insulating film and an insulating film and the like to separate and insulate between wirings, which are incorporated to form integrated circuit. Depending on the material used for each region, the characteristic to be required is differed. In gate insulating film, it is required to be less defect, low leak current, and interface defect level concentration and the like is low. As for a protective film, the characteristic to prevent invasion of, especially, alkali ion and the like is necessary with respect to impurity. Accordingly, there are various usages.

Relating to wiring, with the development of high integration. It is possible to apply the current in a higher concentration than aluminum, and technique using a copper of a high tolerance with respect to an electromigration as a wiring material has been developed.

In the insulating film, it is required that there is no pinhole and the like, cure and in low defect concentration, not including fixed electric, and to be good in adhesives with the base. Furthermore, in order to improve the performance of the transistor with the configuration of element, it is necessary to improve the gate driving capacity by making the gate insulating film thin. Therefore, a cure insulating film that does not increase the gate leak current is required.

As a method to form an insulating film, a CVD method that is a chemical film formation method and a sputtering method that is a physical film-formation method are known. In the CVD method, as a parameter classifying it, there are pressure of during film formation, flow of gas to be supplied, energy for promoting chemical reaction, and the like, and there are thermal CVD method under normal atmosphere or decompression, plasma CVD method using plasma, and the like, which have characteristic in each and are used depending on the purposes.

BRIEF SUMMARY OF THE INVENTION

Forming a polycrystalline silicon film on an insulating film such as glass and quartz and in the case realizing an integrated circuit using it, it was impossible to divert manufacturing technique itself developed in a large-scale integrated circuit. It was not only the problem of crystalline of the polycrystalline silicon film, but also an insulating film conventionally manufactured by various methods and a semiconductor element using it could not exert enough characteristic of desired shape and reliability at present.

A silicon nitride film that is cure and does not penetrate alkali ion can be formed with decompression CVD method; however, film formation temperature of more than 750° C. was necessary. Film can be formed with plasma CVD method; however, there were problem such as film was damaged due to charged particle in the plasma, and likely to have defect and pinhole. Furthermore, under film formation temperature of 500° C. or less, hydrogen is contained in the film, which decreased the stability of film. Regarding this, insulator target of silicon nitride and the like can be also used with high-frequency sputtering method, and silicon nitride film without a contamination of hydrogen into the film can be formed. However, the method was known to have a large compressive stress in general, which peeling of the film was sometimes a problem.

Moreover, in a gate insulating film of TFT formed by depositing the insulating film, an interface level concentration is consequently increased; therefore, a good interface could not be formed. In addition, also from the cleanliness of the interface, it was problem that the polycrystalline silicon film formed on the insulating substrate is likely to be contaminated. In particular, chemical pollution was difficult to identify the cause of pollution and pollutant pathway clearly. Therefore, boron contamination which source is considerable to be filter material of clean room, and phosphorus and organic matter contamination from wall material and sealing material, and the like are difficult to prevent only in daily substrate management; therefore, the more the size of the glass substrate is grown, the more difficult it becomes.

As described above, Cu wiring is formed with damascene structure which the wiring is buried in the insulating film; however, without using an appropriate barrier film, there is a problem that the wiring can be easily diffused into the insulating film and layered interface of surrounding. In order to prevent this, without diffusing the Cu, it is necessary to form a barrier film of a good adhesion with the base.

The present invention has been made in view of the problems mentioned above. An object of the present invention is to apply an insulating film of cure and high quality that is suitably applicable as gate insulating film and protective film to a technique that the insulating film is formed at the glass substrate under a temperature of strain point or lower, and to a semiconductor device realizing high efficiency and high reliability by using it.

In order to solve the problems mentioned above, the present invention assumes that the silicon is used to a target, and nitrogen or nitrogen and noble gas are to form silicon nitride film as a sputtering gas under substrate heat temperature of 300° C. or less with high-frequency magnetron sputtering method. The silicon nitride film can be applied as a gate insulating film of TFT. Furthermore, the present invention laminates the silicon nitride film and oxide film formed on the surface of crystalline silicon film by a chemical treatment, a heat treatment, and light radiation to apply them as a gate insulating film.

In the present invention, silicon is used as a target and the silicon nitride film formed with the high frequency magnetron sputtering method meet at least one of the characteristics shown following. Specifically, one of, preferably, simultaneously meeting several requirements that the etch rate is 10 nm/min or less (preferably, 3.5 nm/min or less), hydrogen concentration is $1\times10^{21}/cm^3$ or less (preferably, $5\times10^{20}/cm^3$ or less), and oxygen concentration is from $5\times10^{18}$ to $5\times10^{21}/cm^3$ (preferably, from $1\times10^{19}$ to $1\times10^{21}$ $cm^3$) in the mixed solution (20° C.) containing an ammonium hydrogen fluoride ($NH_4HF_2$) of 7.13% and an ammonium fluoride ($NH_4F$) of 15.4%. In addition, absolute value of internal stress is set to be $2\times10^{10}$ dyn/$cm^2$ or less, preferably $5\times10^9$ dyn/$cm^2$ or less, and more preferably $5\times10^8$ dyn/$cm^2$ or less.

The present invention contains hydrogen with the concentration of $1\times10^{21}$/$cm^3$ or less, oxygen with the concentration of from $5\times10^{18}$ to $5\times10^{21}$/$cm^3$, and furthermore, provides the silicon nitride film having the characteristic of having an etching rate of 10 nm/min or less with respect to mixed solution containing an ammonium hydrogen fluoride ($NH_4HF_2$) of 7.13% and an ammonium fluoride ($NH_4F$) of 15.4%. The silicon nitride film having such hydrogen and oxygen content and the etching characteristic exists in semiconductor device, and not only as the region where electrical insulation such as gate insulating film and dielectric protective film of capacitor portion is required, but can be also applied as the protective film that diffusion of the gas and ionic impurity is prevented.

The semiconductor device of the present invention is characterized that a gate insulating film, that includes silicon nitride film as at least one layer containing hydrogen with the concentration of $1\times10^{21}$/$cm^3$ or less, oxygen with the concentration of from $5\times10^{18}$ to $5\times10^{21}$/$cm^3$, and having the characteristic of having an etching rate of 10 nm/min or less with respect to mixed solution containing an ammonium hydrogen fluoride ($NH_4HF_2$) of 7.13% and an ammonium fluoride ($NH_4F$) of 15.4%, is formed. In addition, the silicon nitride film, wherein at least one layer as the gate insulating film of the filed effect type transistor with the channel length of from 0.35 to 2.5 μm, is formed.

The foregoing gate insulating film or filed effect type transistor is characterized in that it is formed on the crystalline semiconductor film with radius of curvature of projection portion at the surface of 1 μm or less. The foregoing gate insulating film or the gate insulating film of filed effect type transistor is characterized in that it is formed on the crystalline semiconductor film with radius of curvature of projection portion at the surface of 1 μm or less.

In the present invention, the silicon nitride film having the above composition and etching characteristic contains the combination of either one or several elected from a gate insulating film, a dielectric film of capacitor part protective film of semiconductor element and structure formed on the interlayer insulating film consisted of an organic resin.

By having such hydrogen and oxygen content, and the etching characteristic, in applying into the gate insulating film, a gate leak current can be decreased, electric field effect mobility, subthreshold coefficient, conductance (gm), and the like can be in a good condition, the long-term change of the transistor characteristic in the continuous operation can be decreased, and production yield and disorder in characteristics can be improved. Furthermore, by intervening silicon oxide film between crystalline semiconductor film and silicon nitride film, such effect can be exerted more effectively.

A method for manufacturing the semiconductor device of the present invention contains each step in the crystalline semiconductor film formed on the insulating substrate comprising: a first step for performing an oxidation treatment and an oxide film remove treatment; a second step for forming a silicon nitride film by sputtering a target of silicon under glow discharge of Ar and $N_2$ or only $N_2$ by applying high-frequency electric power; and a third step for forming a conductive film by applying the direct current electric power and characterizes in that said first to third steps are conducted continuously under inert atmosphere or decompression without exposure to the atmosphere. The proportion of Ar with respect to $N_2$ at the above-mentioned second step is set to be preferably from 0.01 to 0.5.

A method for manufacturing the semiconductor device of the present invention contains each step in the crystalline semiconductor film formed on the insulating substrate comprising: a first step for performing an oxidation treatment and an oxide film remove treatment; a second step for forming a silicon oxide film by a heat treatment in an oxidize atmosphere under glow discharge of $O_2$ by applying high-frequency electric power; a third step for forming a silicon nitride film by sputtering target of silicon under glow discharge of Ar and $N_2$ or only $N_2$ by applying high-frequency electric power, and a fourth step for forming conductive film by applying direct current electric power, is characterized in that from said first to fourth steps are conducted continuously under inert atmosphere or decompression without exposure to the atmosphere. The oxide atmosphere in the second step is preferred that one kind of compound or plurality kind of compound selected from the group consisting of $NF_3$, HF, $ClF_3$ is doped into $O_2$ from 0.01 to 0.1%. The proportion of Ar with respect to $N_2$ in the third step is preferable to be from 0.01 to 0.5.

The method for manufacturing the semiconductor device of the present invention above-mentioned can be also applied to the glass substrate of strain point 700° C. or less.

From the method for manufacturing the semiconductor device of the present invention mentioned above, the silicon nitride film can be obtained comprising: at the temperature from room temperature 300° C. or less, preferably 200° C. or less, containing hydrogen with the concentration of $1\times10^{21}$/$cm^3$ or less and oxygen with the concentration of from $5\times10^{18}$ to $5\times10^{21}$/$cm^3$, and having the characteristic of etch rate of 10 nm/min or less with respect to mixed solution containing an ammonium hydrogen fluoride ($NH_4HF_2$) of 7.13% and an ammonium fluoride ($NH_4F$) of 15.4%.

In the method for manufacturing the semiconductor device of the present invention mentioned above, electric power frequency applied in high-frequency magnetron sputtering method can be set at no fewer than 1 MHz, no more than 120 MHz, preferably no fewer than 1 MHz, no more than 60 MHz.

Note that, the semiconductor device in the present invention refers to whole device that can operate by taking advantage of semiconductor characteristic and assumed that electro-optic device, semiconductor circuit, and electron device are all included into the category of the semiconductor device.

BRIEF DESCRIPTION OF THE DRAWINGS

FIG. 1 Graph showing C-V characteristic in case of without diffusion of Li in MOS structure using silicon nitride film on the present invention.

FIG. 2 Graph showing C-V characteristic in case of having diffusion of Li in MOS structure using silicon nitride film on the present invention.

FIG. 3 Graph showing the result that measured concentration of H, C, and O contained in silicon nitride film of the present invention by SIMS.

FIG. 4 Graph showing silicon nitride film of the present invention and transmittance of silicon nitride film of comparative example.

FIG. 5 Graph showing silicon nitride film of the present invention and infrared absorption spectrum of silicon nitride film of comparative example.

FIG. 6 Graph showing C-V characteristic in case of Li diffusion with MOS structure using silicon nitride film formed by plasma CVD method.

FIG. 8 Cross-sectional view describing detail of film formation chamber of magnetron sputtering method applying the present invention.

FIG. 9 Figure describing in pattern film forming mechanism of silicon nitride film in high frequency magnetron sputtering on the present invention.

FIG. 10 Longitudinal sectional view describing a process for manufacturing semiconductor device of the present invention.

FIG. 11 Longitudinal sectional view describing a process for manufacturing semiconductor device of the present invention.

FIG. 12 Longitudinal sectional view describing a process for manufacturing semiconductor device of the present invention.

FIG. 13 Longitudinal sectional view describing a process for manufacturing semiconductor device of the present invention.

FIG. 14 Longitudinal sectional view describing a process for manufacturing semiconductor device of the present invention.

FIG. 15 Longitudinal sectional view describing a process for manufacturing semiconductor device of the present invention.

FIG. 16 Longitudinal sectional view describing a process for manufacturing semiconductor device of the present invention.

FIG. 17 Figure describing detail of etching configuration of semiconductor film.

FIG. 18 Figure describing structure of microcomputer by the present invention.

FIG. 19 Figure describing package structure of microcomputer by the present invention.

FIG. 20 Figure describing structure of heat treatment chamber.

FIG. 21 Figure describing providing method of pulse of light source, temperature variation of semiconductor substrate and cooling medium.

FIG. 22 Longitudinal sectional view describing a process for manufacturing semiconductor device of the present invention.

FIG. 23 Longitudinal sectional view describing a process for manufacturing semiconductor device of the present invention.

DETAILED DESCRIPTION OF THE INVENTION

Figure 7:
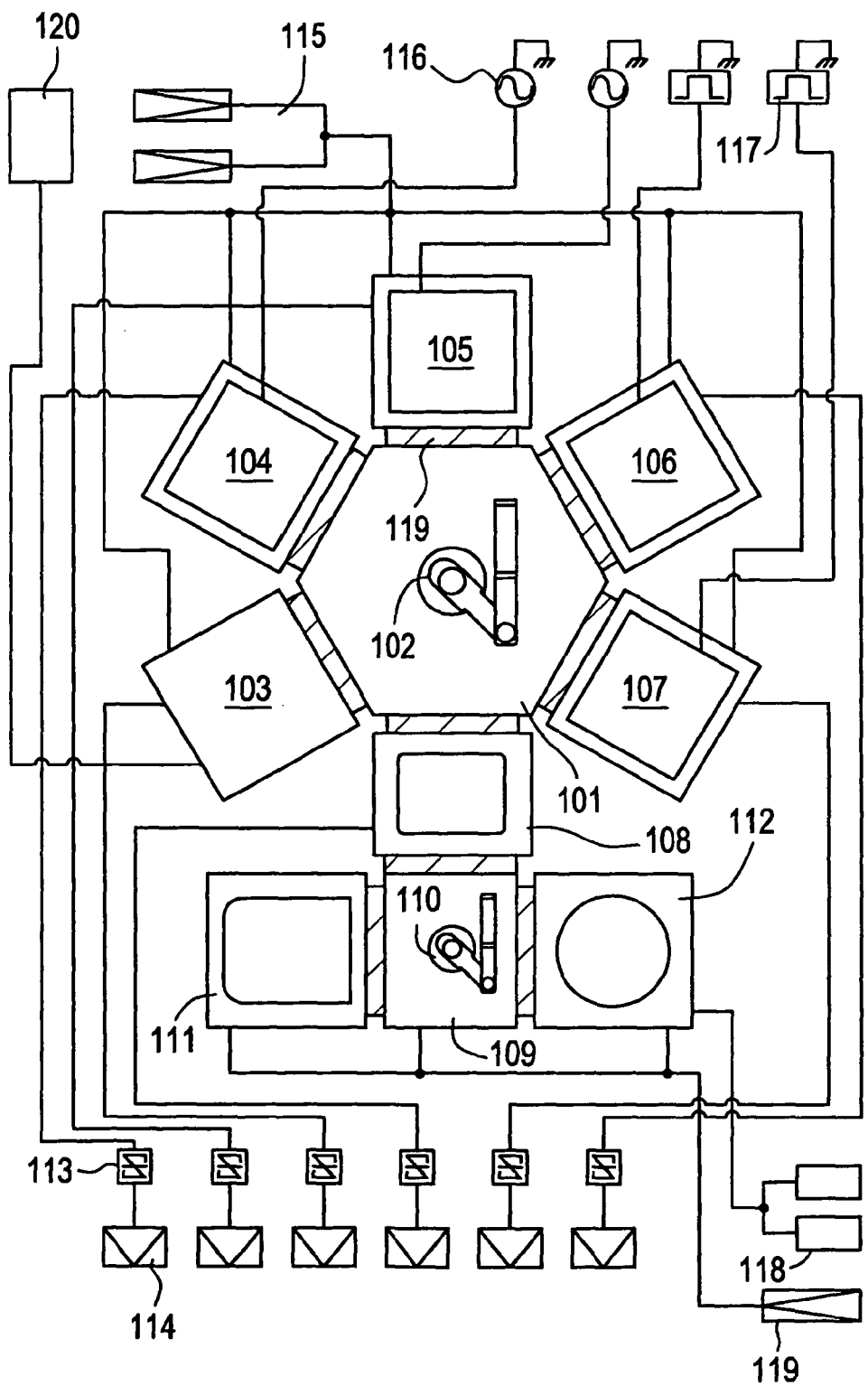
FIG. 7 Top view describing magnetron sputtering device applying the present invention.

In the present invention, for the gate insulating film and protective film of field effect type transistor which is a key component of the semiconductor device, typically, field effect type thin film transistor (hereinafter abbreviated to TFT), or for interlayer insulating film and protective film in an integrated circuit formed on the insulating substrate of interlayer insulating film and protective film, glass, and the like in the display device used liquid crystal and EL, and for gate insulating film and the like of the TFT that constitutes the integrated circuit, single crystal silicon or polycrystalline silicon with oxygen concentration of $1 \times 10^{19}/cm^3$ or less is used as target, nitrogen or nitrogen and rare gas is used as sputtering gas, and a silicon nitride manufactured by high-frequency magnetron sputtering method is used as material by setting the substrate heat temperature in the scope of from room temperature to 300° C. or less.

FIG. 7 is the figure that describes the aspects of suitable multitask type magnetron sputtering/oxide film formation device according to the present invention. The constitution of the device shown in FIG. 7 provides several film formation chambers that can form coating film by sputtering and through gate valve 119 against first common chamber 101 with a transport means 102 of the substrate. In forming the silicon nitride film, one reaction chamber is enough; however, in order to form several films with different aspect continuously without exposing to the atmosphere and without contaminating the interface, the constitution of the device shown in FIG. 7 is suitable.

The substrate that the coating film such as silicon nitride film is formed is charged into load/unload chamber 111, and carried by conveyance means 110 provided in second common chamber 109. Pretreatment chamber 112 is provided with spinner to rotate the substrate, and the treatment of cleaning, oxidation, oxide film remove, and the like of surface to be deposited is possible by applying each kind of chemical through chemical supply means 118. The load/unload chamber 111, the second common chamber 109, and the pretreatment chamber 112 are filled with inert gas, which are used at normal pressure by a gas supply means 130, and intermediate chamber 108 is provided as a chamber to transfer the substrate each other between the first common chamber 101 and several film formation chamber jointed on it. In FIG. 7, it is not shown in detail; however, cassette holder that temporary holds the whole substrate charged into the load/unload chamber 111 may also be provided in the intermediate chamber 108.

In heat treatment chamber 103, heating means 120 is provided, each kind of impurity that contains atmospheric constituent adsorbed on the substrate is withdrawn and cleaned, or a treatment to be cured, crystallized, and the like is conducted by performing a heat treatment to coating film formed by sputtering.

As the constitution of the heat treatment chamber 103, the heating means 120 to conduct a rapid thermal annealing (RTA) may be also provided. FIG. 20 is the figure to describe the heat treatment chamber 103 in detail. In the heat treatment chamber 103, there is reaction chamber 1129 formed with quartz, and outside of it, light source 1110 is provided. Inside of the reaction chamber 1129, there is substrate holder 1112 formed with quartz, and a substrate to be treated is provided on the substrate holder 1112. At this time, the substrate to be treated is formed on the pin in order to uniform a temperature distribution. Furthermore, as a means to monitor temperature heated by the light source 1110, a temperature detection system 1128 using a thermocouple is adopted here.

The light source 1110 makes operation of lighting on and out by power source 1111. Computer 1118 controls operation of the power source and flow control means 1115. A cooling medium introduced in the reaction chamber 1129 may also be circulated and operated by circulator 1116. For the circulate route, it is also important to provide purificator 1117 to keep a purity of He which is a cooling medium.

In addition, in order to make a heat treatment possible under decompression, turbo molecule pump 1119 and dry pump 1120 are provided as vacuum means. Also in a heat treatment under decompression, by using a waveband that a lump light is absorbed into a semiconductor film, it is possible to heat the semiconductor film. In a heat treatment under decompression, oxygen concentration is decreased; therefore, oxidation of the surface of the semiconductor film is controlled, and as a result, it can be contributed to improving the promotion of crystallization and gettering efficiency. The substrate to be treated can be conducted from the conveyance chamber connected through the gate, and the substrate to be treated is set on substrate stage 1112 by the conveyance means.

FIG. 21 is the figure shows about a substrate to be treated heated through the light source and a control method of a flow of the gas floated to the processing chamber. First, the substrate to be treated placed at the room temperature is heated at a high speed through a light source. A temperature rising period is heated up to a present temperature (for example, 1100° C.) under a temperature rising rate of from 100 to 200° C./sec. For example, when the substrate is heated with a programming rate of 150° C./sec. It can be heated up to 1100° C. by a little less than 7 seconds. Thereafter, it is kept in a present temperature for a given time and lighting of light source is blocked out. A hold time is set at from 0.5 to 5 seconds. Therefore, continuous light period of light source is 0.1 second or more, and does not exceed 20 seconds. By floating the gas in process atmosphere, a temperature lowering rate can be set at from 50 to 150° C. For instance, when the substrate is cooled down with a speed of 100° C./sec, it can be cooled down up to 1100° C. to 300° C. by 8 seconds.

As mentioned above, it is characterized in that conducting heating by a light source and cooling cycle by circle of the gas continuously for several times. This is referred as a PPTA (Plural Pulse Thermal Annealing) method. Through PPTA method, actual heating time is shorten, and a light absorbed selectively into a semiconductor film is radiated; therefore, the substrate itself is not heated so much and it is possible to heat selectively only a semiconductor film. A pulse light as shown in FIG. 21 anneals a semiconductor film, and stops the annealing before the anneal is propagated to the substrate side and the annealing is heated from surrounding with a cooling medium; therefore, the temperature of the substrate does not rise so much. Accordingly, the deformation of the substrate can be prevented that was a problem in a conventional RTA device.

Lighting time of a light source per a time is from 0.1 to 60 seconds, preferably from 0.1 to 20 seconds, and a light from the light source is radiated for several times. In addition, a light from a light source is radiated in pulsed so that the hold time of the highest temperature of a semiconductor film is from 0.5 to 5 seconds. Furthermore, with the blink of a light source, a heat treatment effect of a semiconductor film is increased and the damage of substrate by heat is prevented by increasing and decreasing the supply of cooling material. Also, a vacuum means decompressing the inside of a treatment chamber is provided, and oxygen concentration in a heat treatment atmosphere is decreased. Therefore, the oxidization and contaminant of semiconductor film surface can be prevented.

In FIG. 7, target of different materials are implanted in film formation chambers from 104 to 107; therefore, several of coating films can be layered continuously under decompression. In each of the film formation chambers, gas supply means 115 that supplies sputtering gas, vacuum means 114 and pressure control means 113 are provided. In the film formation chamber 104 and 105, target of an insulating material is provided, and high-frequency power source 116 for sputtering is connected. In the frequency of electric power that high-frequency electric source supplies, a frequency of no few than 1 MHz, no more than 20 MHz, preferably no few than 10 MHz, no more than 60 MHz is applied. In the applicable scope of the frequency mentioned-above, a sheathe potential is decreased as it increases, and even in a sputtering method by physical film formation mechanism, it is expected that a film formation by chemical reaction is dominated and that cure coating film is formed. Furthermore, metal target is provided in the film formation chamber 106 and 107 and direct current power source 117 is connected.

FIG. 8 is the figure that illustrates the detail of the film formation chamber 105 as an example. The film formation chamber 105 is where silicon nitride film concerning the present invention is formed. The target 120 is silicon and cooled down by cooling material through backing plate. Permanent magnet 124 makes circular motion or linear motion to a direction parallel to the gate phase; therefore, it is possible to form a coating film with a good uniformity of film thickness on a surface of the opposite substrate. Shutter 123 opens and shut at before and after of the beginning of film formation, and the coating film is prevented from being formed in a condition that the plasma is unstable in the early stages of discharge. In substrate hold means 122, the holder goes up and down and the substrate is mounted and fixed to the backboard 121. Inside of the backboard 121, as heating means 128, sheathe heater is buried or rare gas that is heated is introduced from the backside of the substrate to increase the thermal uniformity. From gas introduction means 115; a nitrogen gas is introduced besides rare gas, and pressure inside of the film formation chamber 105 has the structure to be controlled by conductance valve 126. Rectify board 125 is provided with the purpose to rectify the flow of sputtering gas inside the film formation chamber 105. For the target, it is connected to the high-frequency power source, and sputtering is conducted by applying the high-frequency electric power.

Through a high-frequency wave magnetron sputtering according to the constitution of FIG. 8, a cure silicon nitride film can be formed assuming silicon as a target As a main film formation condition, silicon is used as a target material and mixed gas of only $N_2$ or $N_2$ and Ar are used as a sputtering gas. The frequency of high-frequency electric power to be applied is typically 13.56 MHz; however, higher frequency of from 27 to 120 MHz may also be applied. In accordance with the increase of frequency, chemical reaction is much preceded at the mechanism of film formation, and film formation that is cure and with less damage against the base can be expected. Ar used as a sputtering gas is introduced from the backside of the substrate as shown in FIG. 8 as a gas to anneal the substrate, and finally, it is mixed with $N_2$ and is contributed to the sputtering.

In Table 1 shown below, typical example of film formation condition is shown. Needless to say, the deposition condition shown here is one example, and it can be set appropriately in the scope filling the key film formation condition mentioned above.

TABLE 1

| | Silicon Nitride Film | Silicon Oxide Film |
|---|---|---|
| Gas | Ar/$N_2$ | $O_2$ |
| Flow Rate | 20/20 | 5 |
| Pressure (Pa) | 0.8 | 0.4 |
| Frequency (MHz) | 13.56 | 13.56 |
| Power (W/cm$^2$) | 16.5 | 11.0 |
| Substrate Temperature (° C.) | 200 | 200 |
| Target Material | Si(1~10Ω cm) | |
| T/S (mm) | 60 | 150 |

Furthermore, as comparative example, a film formation condition of a silicon nitride film formed by conventional plasma CVD method is shown in Table 2.

TABLE 2

| | Silicon Nitride Film |
|---|---|
| Gas | $SiH_4/NH_3/N_2/H_2$ |
| Flow Rate | 30/240/300/60 |
| Pressure (Pa) | 159 |
| Frequency (MHz) | 13.56 |
| Power (W/cm$^2$) | 0.35 |
| Substrate Temperature (° C.) | 325 |

Next, the result compared about the silicon nitride film formed under the deposition condition of Table 1 and typical attribute of the silicon nitride formed under Table 2. Note that, the difference between "RFSP-SiN (No. 1)" and "RFSP-SiN (No. 2)" in the sample is the difference of sputtering device and does not damage the function as the silicon nitride film in the present invention. In addition, positive and negative numeric of compressive stress and a tensile stress are varied in internal stress; however, only absolute value is treated here.

TABLE 3

| | Silicon Nitride Rim By Condition of Table 1 | | SiN Film By Condition of Table 2 | |
|---|---|---|---|---|
| | RFSP-SiN(No. 1) | RFSP-SiN(No. 2) | PCVD-SiN | Remarks |
| Relative Dielectric Constant | 7.02~9.30 | ← | ~7 | |
| Refractive Index | 1.91~2.13 | ← | 2.0~2.1 | Wave Length 632.8 nm |
| Internal Stress | $4.17 \times 10^8$ | ← | $9.11 \times 10^8$ | |
| Etch Rate | 0.77~1.31 | 1~8.6 | ~30 | LAL500 20° C. |
| Si Concentration (Atomic %) | 37.3 | 51.5 | 35.0 | RBS |
| N Concentration (Atomic %) | 55.9 | 48.5 | 45.0 | RBS |
| H Concentration (Atoms/cc) | $4 \times 10^{20}$ | — | $1 \times 10^{22}$ | SIMS |
| O Concentration (atoms/cc) | $8/10^{20}$ | — | $3 \times 10^{18}$ | SIMS |
| C Concentration (atoms/cc) | $1 \times 10^{19}$ | — | $4 \times 10^{17}$ | SIMS |

As shown in Table 3, characteristic difference with respect to sample of comparative example manufactured with plasma CVD method and sample of "RFSP-SiN (No. 1)" and "RFSP-SiN (No. 2)" manufactured with the high-frequency magnetron sputtering method mentioned above lies in that the etch rate in the mixed solution of 20° C. (LAL 500 SA buffered hydrogen fluoride; produced by Hashimoto Chemical Co.) containing an ammonium hydrogen fluoride ($NH_4HF_2$) of 7.13% and an ammonium fluoride ($NH_4F$) of 15.4% is extremely slow, and that the content of hydrogen is extremely little. Furthermore, compared with absolute value, internal stress is in a more small value than a silicon nitride film formed with plasma CVD method.

An impurity concentration of hydrogen, oxygen, and carbon in the silicon nitride film is inquired by second ion mass spectrometry (SIMS), and the result of the direction analysis of its depth is shown in FIG. 3. A sample is a silicon nitride film formed under the condition in accordance with Table 1 on the single crystal silicon substrate, and it is relevant that the hydrogen concentration is $1 \times 10^{21}/cm^3$ or less. Presence or absence of hydrogen bond is inquired also by Fourier transform infrared spectroscopy (FT-IR), and its result is shown in FIG. 5 compared with the characteristic of a silicon nitride film manufactured with plasma CVD method. Absorption peak by Si—H bond and N—H bond is not observed even by the analysis of FT-IR.

In addition, a transmittance measured with spectrophotometer is shown in FIG. 4, and the characteristic of a silicon nitride film manufactured with plasma CVD method through the condition shown in Table 2 is also shown in the figure for a comparative reference. Distinguished difference cannot be seen between them and can be understood that the both are the films with a good transparency.

The characteristic mentioned above shows typical result, and the key characteristic of a silicon nitride film manufactured with high frequency magnetron sputtering method concerning the present invention is as indicated below from the result of the experiment of various kinds.

The silicon nitride film on the present invention, as the result of considering variously, fills at least one of characteristics shown in the following. Specifically, one of, preferably, simultaneously meeting several requirements that an etching rate is 10 nm/min or less (preferably, 3.5 nm/min or less), hydrogen concentration is $1 \times 10^{21}/cm^3$ or less (preferably, $5 \times 10^{20}/cm^3$ or less), and oxygen concentration is from $5 \times 10^{18}$ to $5 \times 10^{21}/cm^3$ (preferably, from $1 \times 10^{19}$ to $1 \times 10^{21}/cm^3$) in the mixed solution (20° C.) containing an ammonium hydrogen fluoride ($NH_4HF_2$) of 7.13% and an ammonium fluoride ($NH_4F$) of 15.4%. In addition, absolute value of internal stress is set to be $2 \times 10^{10}$ dyn/cm$^2$ or less, preferably $5 \times 10^9$ dyn/cm$^2$ or less, and more preferably $5 \times 10^8$ dyn/cm$^2$ or less. With a small internal stress, in the case that it is laminated with other film, it can control the cause of defect level in the interface and the problems of peeling and the like does not occur.

Furthermore, the silicon nitride film of the present invention having the above-mentioned characteristic has extremely high blocking effect with respect to an element of Group 1 and 2 in the periodic table, typical example of Na and Li, and the diffusion of mobile ion can be controlled. The data showing the fact simply is shown in FIG. 1, FIG. 2, and FIG. 6. FIG. 6 is the chart showing the transition of C-V characteristic in before and after of the results of bias-thermal stress (B-T stress) test of MOS structure which assumed the silicon nitride film that formed film with plasma CVD method under the condition of Table 2 as dielectric. The structure of the sample is the one that forms the silicon nitride film of 100 nm under the condition of Table 2 on a single crystal silicon substrate (n-type, from 1 to 10 Ωcm), and the one that formed a metal doped (from 0.2 to 1.5% by weight) Al with Li above it as an electrode (1 mm in diameter). In the structure of this sample, Al electrode is doped with Li; therefore, the presence or absence of Li diffusion can be inquired. The condition of B-T stress test was conducted under the condition that holds an hour at 150° C. applying the pressure of 1.7 MV. In accordance with FIG. 6, C-V characteristic shift largely from the BT stress test, and the effect that Li is diffused from the electrode doped Al formed on the silicon nitride film with Li can be confirmed dominantly.

FIG. 1 and FIG. 2 show C-V characteristic in before and after of B-T stress test in the sample of MOS structure that assumed the silicon nitride film manufactured under the condition of Table 1 as dielectric film. The sample of FIG. 1 is the one that formed an electrode on the silicon nitride film with Al—Si (Al doped with silicon), and FIG. 2 is the sample formed an electrode with Al—Li. However, an oxide film of 50 nm is formed on the surface of a single crystal silicon substrate (p-type, from 1 to 10 Ωcm) in the sample. This is formed with the purpose to decrease the effect of interface level of the silicon nitride film and silicon substrate. Accordingly, it does not give any effect to blocking with respect to Li of the silicon nitride film.

Comparing the characteristic of FIG. 1 and FIG. 2, there is hardly any transition of C-V characteristic in before and after of B-T stress test in the both chart. It can be confirmed that the effect from the diffusion of Li is not show up, specifically; the silicon nitride film manufactured under the film formation condition of Table 1 is functioned as blocking film. As mentioned-above, although the silicon nitride film concerning the present invention is formed with the temperature of 300° C. or lower, it is extremely cure and can be confirmed that the blocking effect with respect to mobile ion such as Na and Li is high.

The extremely cure silicon nitride film confirmed at the above-mentioned B-T stress test and the like differs from physical film forming mechanism by the conventional sputtering phenomena, and it can be considered that nitrogen or nitrogen, rare gas ion, and silicon are reacting each other in the target surface and surface to be deposited, and that they are concerned to a film formation.

An inquiry example of the film formation mechanism is described with a pattern diagram of FIG. 9. When high-frequency electric power is applied in target 901 to form glow discharge plasma, various ion species, excitation species, and luminescence species referring to nitrogen or nitrogen and rare gas are formed. Among them, activated nitrogen that has extremely active characteristic is generated. It is known that the activated nitrogen is extremely strong in reactivity and that a nitride is formed relative easily even under a low temperature. Accordingly, the activated nitrogen diffused on the target surface reacts with silicon and then forms a nitride. The silicon nitride is stable; however, when rare gas ion or nitrogen ion is speeded up with a sheathe electric field and made incident, it is made sputtering and discharged within gas phase. The nitride of the silicon diffused within the glow discharge plasma 900 is reacted with activated nitrogen and excited species of other nitrogen in its process, and one of them reaches to the substrate surface. Consequently, nitride of silicon is made surface reaction and silicon nitride film is formed. It is considerable that the assist of an ion species to be made incidence by speeded from a potential difference of ground potential and plasma potential is operated. From such a film formation mechanism, duster of silicon is not included within the silicon nitride film, which is presumed to improve the cure of the film.

The film formation mechanism as described above, with a higher proportion of rare gas than that of nitrogen to be provided, sputtering by a rare gas ion is dominant and cannot be realized. Ideally, only nitrogen gas may be used; however, a film formation rate is decreased significantly; therefore, it is preferable to select within the scope that the mixed ratio of nitrogen and rare gas is one on one at most.

Concerning the aspect of semiconductor device using the above silicon nitride film and manufacture device is illustrated below in detail using drawings.

Embodiment 1

For the substrate applicable at the present embodiment, a glass substrate which material is barium borosilicate glass, alumino borosilicate glass, aluminum silicate glass, and the like are suitable. Typically, a glass substrate 1737 produced by Corning Co. (strain point of 667° C.), AN100 produced by Asahi Glass Co. (strain point of 670° C.), and the like are applicable; however, it should be noted that there is no particular limit as long as other similar substrates. In either case, a glass substrate with strain point of 700° C. or less is applicable in the present invention. The present embodiment gives description concerning one embodiment that forms Micro Processor Unit (MPU) using the silicon nitride film manufactured with high-frequency magnetron sputtering method on the glass substrate with strain point of 700° C. or less.

Note that, in the present invention, the substrate with strain point of 700° C. or higher is not excluded. Needless to say, a synthesized quartz substrate that has heat-resistant temperature of 1000° C. or higher may also be applied. In the silicon nitride film concerning the present invention, a cured film with a high blocking under the temperature of 700° C. or less can be formed, and in its characteristic, there is no need to select the synthesized quartz substrate particularly.

Selected from the above substrate and as shown in FIG. 10(A), first inorganic insulating layer 201 consisted of insulating film of silicon oxide film, silicon nitride film or silicon oxynitride film ($SiO_xN_y$), and the like is formed on glass substrate 200. A typical example has a doubled-layered structure, and has a layered structure of first silicon oxynitride film 202 to have a thickness of 50 nm are formed as reactive gases which are $SiH_4$, $NH_3$, and $N_2O$ by plasma CVD and second silicon oxynitride film 203 to have a thickness of 100 nm are formed as reactive gases which are $SiH_4$ and $N_2O$ by plasma CVD. Herein, the first oxynitride film 202 may be also replaced with a silicon nitride film formed with high-frequency magnetron sputtering method. The silicon nitride film can prevent the alkali metal element such as Na from diffusing that is contained a slight amount in the glass substrate.

A crystalline silicon film assumed as active layer of TFT is obtained by crystallizing non-crystalline silicon film 204 formed on the first inorganic insulating layer 201. Furthermore, in place of the non-crystalline silicon film, non-crystalline silicon germanium ($Si_{1-x}Ge_x$; x=0.001-0.05) film may be also applied. The thickness of non-crystalline silicon film that is formed first is selected within the scope that the thickness of yield crystalline silicon film is from 20 nm to 60 nm. The upper limit of the film thickness is the upper value to make work as complete depletion type in a channel formation region of TFT, the lower value of the film thickness is the limit of the process, and is decided as minimum value which is necessary in the case to process selectively in the etching step of a crystalline silicon film.

In the process of crystallization, there is no particular limit to the method. For example, as an exemplary crystallization method, with respect to the crystallization of semiconductor such as nickel, a metal element that has catalytic action may also be doped with and crystallized. In this case, after holding a layer containing nickel on the non-crystalline silicon film 204, continuing the dehydrogenation (500° C., 1 hour), it is crystallized by a heat treatment with 550° C. for 4 hours.

FIG. 10(B) shows the condition that crystalline silicon film 206 is formed. Under the condition, a crystalline silicon film can be obtained that is crystallized at the rate of from 50 to 95%; however, as shown in FIG. 10(C), in order to improve the crystalline much, a laser annealing treatment is added that radiates a second harmonic wave of excimer laser of pulse oscillation or solid state laser such as YAG laser, $YVO_4$ laser, and YLF laser. In a laser annealing treatment, the laser light is radiated with a overlap ration of from 90 to 98% as linear laser light with the width of the short side direction of 400 μm in the optical system. Through the radiation of the pulse laser light, several convex portions with a height as same as film thickness are formed on the surface as maximal value as shown in FIG. 10(C).

When a gate insulating film is formed on the crystalline silicon film to form top gate type TFT, gate leak current is increased. Furthermore, the characteristic is also deteriorated by stress test that a bias voltage is applied to the gate electrode. This is considered because the electric field is concentrated at convex portion. Accordingly, it is preferable to set the maximal value of the uneven shape in the surface of the crystalline silicon film at 10 nm or less, preferably 5 nm or less.

In order to decrease the unevenness of the surface, it can be realized by performing an oxidation treatment with ozone-containing solution and an oxide film remove treatment by performing a hydrofluoric acid-containing solution once, preferably repeating several times. In the present embodiment, in order to manufacture TFT with a channel length of from 0.35 to 2.5 μm, and to set substantial thickness of gate insulating film to from 30 to 80 nm, regarding to the smoothness of the surface of the crystalline silicon film, maximal value of uneven shape is set to be 10 nm or less, preferably 5 nm or less (FIG. 10(D)).

Thereafter, the obtained crystalline silicon film is performed an etching treatment into a desired shape by photoresist process using photomask to form semiconductor films from 216 to 218 that forms active layer containing channel formation region, source and drain region, low-concentration impurity region, and the like in TFT (FIG. 12(A)).

In order to conduct etching to the crystalline silicon film formed under the condition of FIG. 10(D), mixed gas of $CF_4$ and $O_2$ is used as etching gas using dry etching method, and in order to improve step coverage of gate insulating film, the semiconductor films from 216 to 218 are processed to have a taper angle of from 30° to 60° at the edge of the films. Its detail is shown in FIG. 17. With the relation to selection ratio with the base, silicon oxynitride film is also barely etched; however, the depth of its spot facing is set to be one third or lower of thickness d of the semiconductor film. In the case that the spot facing is deep, the gate insulating film is not clad, and causes a failure that a gate wiring formed on its above layer is disconnected. Furthermore, against the semiconductor film from 216 to 218, impurity element imparting p-type may also be doped to control a threshold value (Vth). Group 13 of periodic law of boron (B), aluminum (Al), gallium (Ga), and the like is subject to impurity element imparting p-type against the semiconductor.

Next, as shown in FIG. 12(B), silicon oxide film 219 and silicon nitride film 220 that form gate insulating film on the semiconductor film from 216 to 218 are formed with high-frequency magnetron sputtering method, and formed continuously under decompression without exposure of first conductive film 221 and second conductive film 222 that form gate electrode to the atmosphere.

The multitask type magnetron sputtering device described in FIG. 7 has the structure appropriate for the step. The abstract of the step to form from the gate insulating film up to gate electrode is as described below.

Substrate conveyed from the load/unload chamber 111 is under the condition of FIG. 12(A). A smoothing treatment of surface mentioned above can be performed at the pretreatment chamber 112 provided with spinner, an oxidation treatment by ozone-containing solution and an oxide film remove treatment by hydrofluoric acid-containing solution are performed, and etching is conducted to the surface of semiconductor film, mainly the convex portion. Furthermore, there is also a characteristic that the surface of the semiconductor film is etched and ended with hydrogen, thereby clean and inactive surface is formed.

Afterwards, the substrate is conveyed to the first common chamber 101 conducted vacuum discharge through the intermediate chamber 108. The heating means 120 is provided in the heat treatment chamber 103, and moisture adsorbed on the substrate is withdrawn and cleaned. In the film formation chamber 104, silicon oxide film is formed to have a thickness of from 10 to 60 nm assuming synthesized quartz as target by high frequency magnetron sputtering method. Main film formation condition is set to sputtering gas of $O_2$, pressure of 0.4 pa at the sputtering, electric discharge of 11.0 mW/cm², 13.56 MHz, and substrate heat temperature of 200° C. Through the condition, the semiconductor film and interface level concentration are low, and the cure silicon oxide film 219 can be formed. Next, the substrate is transferred to the film formation chamber 105, and a silicon nitride film is formed with a thickness of from 10 to 30 nm with high-frequency magnetron sputtering method. The film formation condition is same as Table 1. With respect to relative dielectric constant of 3.8, that of silicon nitride is about 7.5; therefore, the same effect as making thin film of gate insulating film can be obtained substantially by containing silicon nitride film in gate insulating film that forms with silicon oxide film.

Specifically, regarding smoothness of the surface of the crystalline silicon film, maximal value of uneven shape is set to 10 nm or less, preferably 5 nm or less, and by assuming doubled-layered structure of silicon oxide film and silicon nitride film in the gate insulating film, gate leak current can be decreased even setting all thickness of the gate insulating film to from 30 to 80 nm, and TFT can be driven TFT at from 2.5 to 10 V, typically, from 3.0 to 5.5 V.

In addition, also contaminant of gate insulating film and electrode interface is a cause of disorder of TFT characteristic; therefore, after gate insulating film is formed, the first conductive film 221 made of tantalum nitride (TaN) with a film thickness of from 10 to 50 nm and the second conductive film 222 made of tungsten (W) with a film thickness of from 100 to 400 nm are layered continuously. As a conductivity material to form gate electrode, it is formed with element elected from Ta, W, Ti, Mo, Al, and Cu, or alloy material mainly containing the element or compound material. Semiconductor film, typical example of polycrystalline silicon film doped with impurity element such as phosphorus may also be used. Furthermore, the combination that the first conductive film is formed with tantalum (Ta) film and the second conductive film is formed with W film, the combination that the first conductive film is tantalum nitride (TaN) film and the second conductive film is Al film, and the combination that the first conductive film is tantalum nitride (TaN) film and the second conductive film is Cu film may also be applied.

Next, as shown in FIG. 12(C), resist mask 223 formed gate electrode pattern is formed by photoresist process. Thereafter, a first etching treatment is performed by dry etching method. For etching, for example, ICP (Inductively Couple Plasma) etching method is applied. There is no limitation to etching gas; however, $CF_4$, $Cl_2$, and $O_2$ are preferred to use for etching W or TaN. In the first etching treatment, predetermined bias voltage is applied at the substrate side and graded angle of from 15° to 50° is given at the side of gate electrode pattern 224 of the first shape to be formed. Depending on the etching condition; however, the silicon nitride film 220 formed as gate insulating film by the first etching treatment is remained at the bottom of gate electrode pattern 224 of the first shape, and the silicon oxide film 219 is exposed. Afterwards, alerting to the second etching condition, using $SF_6$, $Cl_2$, and $O_2$ for etching gas, anisotropic etching of W film is conducted assuming bias voltage applied at the substrate side as predetermined value. Accordingly, gate electrode 224 and 225 are formed. Thereafter, the resist mask 223 is removed.

Gate electrode has layered structure of the first conductive film 221 and the second conductive film 222, and the first conductive film has the structure protruded as appentice. Thereafter, a doping treatment is performed as shown in FIG. 12(A), and impurity region is formed in each of semiconductor film. Doping condition may be set appropriately. First n-type impurity region 227 formed at the semiconductor film 216 forms low-concentration drain and second n-type impurity region 228 forms source or drain region. First p-type impurity region 230 formed at the semiconductor film 217 forms low-concentration drain and second p-type impurity region 231 forms source or drain region. Channel formation region 226 and 229 in each of semiconductor film is placed between low-concentration drain regions. The semiconductor film 218 is a member to form capacitor portion and impurity is doped with the same concentration as the second impurity region.

As shown in FIG. 16(A), silicon oxynitride film 274 containing hydrogen is formed with a thickness of 50 nm by plasma CVD method, and semiconductor film is hydrogenated by a heat treatment of from 350° to 550°. For the heat treatment, RTA heat treatment device shown in FIGS. 20 and 21 is used. Furthermore, an activation treatment of the above-mentioned impurity can be also performed at the same time as well as hydrogenation.

Interlayer insulating film 275 is formed in predetermined pattern with organic resin material of photosensitivity mainly containing acryl or polyimide. Thereafter, protective film 276 is formed with silicon nitride film by high-frequency magnetron sputtering method. As the film thickness is set to from 50 to 500 nm, blocking operation can be obtained that prevents intrusion of impurity of each ionic including oxygen and moisture in the atmosphere. Then, contact hall 277 is formed with dry etching (FIG. 16 (B)).

Thereafter, as shown in FIG. 16(C), wirings from 278a to 278d and 279 are formed using Al, Ti, Mo, W, and the like. Layered film of Ti with a film thickness of from 50 to 250 nm and alloy film (alloy film of Al and Ti) with a film thickness of from 300 to 500 nm is used for an exemplary wiring structure.

As described above, n-channel type TFT 303, p-channel type TFT 304, and capacitor portion 305 can be formed. At least one layer of silicon nitride film is contained in gate insulating film of each TFT. In the capacitor 305, at least one layer of silicon nitride film (276) is contained as dielectric film. The silicon nitride film has characteristic of the present invention such as that the etch rate is 10 nm/min or less with respect to mixed solution containing an ammonium hydrogen fluoride ($NH_4HF_2$) of 7.13% and an ammonium fluoride ($NH_4F$) of 15.4%.

Embodiment 2

In Embodiment 1, after the crystalline silicon film shown in FIG. 10(B) is obtained, as shown in FIG. 11, YAG laser, $YVO_4$ laser, and YLF laser can be used as solid state laser of continuous oscillation type. Second higher harmonic wave of YAG laser, $YVO_4$ laser, and YLF laser is radiated. For example, second higher harmonic wave (532 nm) of $YVO_4$ laser is concentrated into a linear shape, scanned at the speed of from 1 to 100 cm/sec to improve crystalline. Crystalline silicon film having smooth surface can be obtained by using continuous oscillation laser in the step, and can be set the maximal value of uneven shape of the surface to 10 nm or less, preferably 5 nm or less.

Embodiment 3

In the present embodiment, the structure of gate electrode is differed, and the structure of semiconductor device much appropriated to configurations is described referring to the drawings. It should be noted that the silicon nitride film on the present invention is also applied in each region of the semiconductor device.

In FIG. 13(A), the semiconductor films from 216 to 218 are formed as same as Embodiment 1. In gate insulating film 240, silicon nitride film manufactured by high-frequency magnetron sputtering method with a thickness of from 10 to 80 nm is applied; however, in the interface with semiconductor, silicon oxide film with a thickness of from 1 to 5 nm formed by sputtering or an oxidation plasma treatment is intervened. Accordingly, this can prevent from increasing interface level concentration by contacting silicon nitride film and semiconductor film directly, and the damage during film formation can be decreased.

Gate electrodes 243, 244 and capacitor electrode 245 are formed with first conductive film 241 made of tantalum nitride (TaN) with a film thickness of from 10 to 50 nm and second conductive film 242 made of tungsten (W) with a film thickness of from 100 to 400 nm as well as Embodiment 1.

Thereafter, as shown in FIG. 13(B), first n-type impurity region 246, 248, and first p-type impurity region 247 are formed by a doping treatment The impurity regions are formed so as to make superposition with the first conductive film 241 assuming the second conductive film 242 as a mask.

In FIG. 13(C), sidewall spacers from 249 to 251 of gate electrodes are formed with silicon oxide film. Silicon oxide film is formed entirely with plasma CVD method, and etched uniformly over the entire film with anisotropic dry etching to form a sidewall spacer. Assuming gate electrode as a mask, second n-type impurity region 252, 254, and second p-type impurity region 253 are formed.

As shown in FIG. 14(A), silicon oxynitride film 256 contained hydrogen is formed with a thickness of 50 nm by plasma CVD method. Furthermore, silicon nitride film 257 manufactured by high-frequency magnetron sputtering method is formed. Thereafter, it is hydrogenated by a heat treatment of 410° C., and the hydrogen is prevented from diffusing the hydrogen within gas phases by the silicon nitride film 257 and the effect of hydrogenation can be increased. In place of the silicon nitride film 257, aluminum oxynitride (AlNxOy: X=from 2.5 to 47.5 atom %) may also be applied. Besides the effect like silicon nitride film, the oxynitride aluminum can obtain effect that diffuse the heat generation of TFT since its heat conductivity is high. Specifically, the integration level can be improved by making configuration of elements; therefore, the effect of the heat generation can be decreased.

Interlayer insulating film 258 can be formed with silicon oxide film made by plasma CVD method, phosphorus glass (PSG), boron glass (BSG), or phosphorous boron glass (PBSG) made by atmospheric pressure CVD method, and most preferably, aperture of contact portion is formed at the same time as formation of coating film by photo organic resist such as polyimide and acryl.

Then, wiring 259 is formed using Al, Ti, Mo, W, and the like. Silicon nitride film 260 is formed with a thickness of from 20 to 100 nm by high-frequency magnetron sputtering method to cover the wiring 259 and interlayer insulating film 258. This is set to be a barrier film that prevents the diffusion of Cu in forming the Cu wiring on the upper layer.

Then, second interlayer insulating film 261 is formed with a thickness of from 0.5 to 5 μm using silicon oxide film or organic resin material. An opening to form wiring on the second interlayer insulating film 261 is formed, thereafter, barrier layer 262 made of tantalum nitride film is formed with a thickness of from 100 to 200 nm with sputtering method over the entire surface. The tantalum nitride film is used as barrier layer that prevents diffusion of Cu. Furthermore, Cu film is formed with sputtering method to form seed layer, and Cu layer 263 is formed with a thickness of from 1 to 10 μm by plating method, using copper sulfate. Besides plating method, the Cu layer is formed with sputtering method and planarization can be also realized by reflowing under a heat treatment of 450° C. (FIG. 14(C)).

The Cu layer 263 is conducted etching process to form Cu wiring 264. The Cu wiring is easily oxidized and thermally unstable; therefore, protective film, which the Cu wiring is clad, is formed with a thickness of from 20 to 200 nm with silicon nitride film 265 by high-frequency magnetron sputtering method. The silicon nitride film is cure, and oxidation of Cu and diffusion over periphery region can be prevented. In addition, by interposing the Cu wiring 264 between the silicon nitride film 260 and the silicon nitride film 265, TFT can be prevented from being contaminated. Furthermore, if necessary, third interlayer insulating film 266 is formed, and multi-layered wiring is formed under the same operation as FIG. 14(C), and semiconductor device such as microprocessor and memory can be formed.

Embodiment 4

In the present embodiment, one embodiment that forms Cu wiring by damascene is described by using FIG. 15. It should be noted that silicon nitride film on the present invention is also applied in each region of the semiconductor device.

First, the structure of FIG. 14(B) by the condition as like Embodiment 3 is formed. Specifically, the silicon nitride film 260 is formed on the upper layer of the wiring 259. Thereafter, second interlayer insulating film 267 is formed with a thickness of from 1 to 5 μm using silicon oxide film or organic resin film. After forming silicon nitride film 268 on the second interlayer insulating film 267, opening 269 to form wiring is formed (FIG. 15 (A)).

Furthermore, third interlayer insulating film 270 is formed and fit in a portion of the contour opening 269, and opening 272 with much wider than opening width of it are formed. Afterwards, tantalum nitride film 271 is formed with a thickness of from 100 to 200 nm over the entire surface with sputtering method. The tantalum nitride film comes to be a layer to prevent a diffusion of Cu (FIG. 15(B)).

Moreover, Cu film is formed with sputtering method, and after forming seed layer, the Cu film is formed with a thickness of from 1 to 10 μm by plating method, using copper sulfate. Besides plating method, the Cu is formed with sputtering method and planarization can be also realized by reflowing a heat treatment of 450° C.

Next, starting polishing from the surface of Cu plating layer using CMP (Chemical-Mechanical Polishing) method, polishing is conducted until the third interlayer insulating film 270 is exposed, and planarization is conducted as shown in FIG. 15(C). As described above, the Cu wiring 273 is formed. Slurry of CMP is consisted of abrasive coating, oxidant, and additive, and alumina or silica is used for abrasive coating. For oxidant, iron nitrate, hydrogen peroxide, potassium periodic acid, and the like are used. Accordingly, wiring consisted of the barrier layer 271 and Cu layer 273 is formed. On its upper layer, silicon nitride film 274 is formed and may also be assumed as protective film. By interposing the Cu wiring 273 with the silicon nitride film 260, the silicon nitride film 268, and the silicon nitride film 274, TFT can be prevented from being contaminated by Cu.

Embodiment 5

In the present embodiment, using synthesized quartz with much higher planarity compared with glass substrate, the structure of semiconductor device much appropriated to configurations is described referring to FIG. 22 and FIG. 23. It should be noted that silicon-nitride-film on the present invention is applied also in each region of the semiconductor device.

Crystalline silicon film is formed on the quartz substrate 200. For the crystalline silicon film, the one formed by crystallizing non-crystalline silicon film under a heat treatment of from 600 to 900° C. or the one crystallized under from 500 to 700° C. by adding element, which is catalyst of crystallization for silicon such as Ni, to non-crystalline silicon film can be applied. For the latter case, after crystalline silicon film can be obtained, a heat treatment is performed for from 1 to 12 hours within oxide atmosphere of from 850 to 1050° C., preferably 950° C., containing halogen, and element to be catalyst may be removed by gettering.

Thereafter, as shown in FIG. 22(A), the semiconductor films from 216 to 218 divided in island configuration are formed from the crystalline silicon film. Furthermore, using PPTA method described in FIG. 7 and FIG. 20, silicon oxide film 280 of from 1 to 5 nm is formed on the surfaces of the semiconductor films from 216 to 218 by a heat oxidation treatment. One or more kinds selected from $NF_3$, HF, and $ClF_3$ is added to oxygen from 0.01 to 0.1% to perform an oxidation treatment, and F may also be contained in the silicon oxide film.

As shown in FIG. 22(B), for the gate insulating film 240, silicon nitride manufactured by high frequency magnetron sputtering method with a thickness of from 10 to 80 nm is applied; however, in the interface with the semiconductor film, the silicon oxide film 280 with a thickness of from 1 to 5 nm formed by heat oxidation treatment is intervened. By the silicon oxide film, it can prevent the silicon nitride film and the semiconductor film from contacting directly and from increasing the interface level concentration, and furthermore, it is possible to decrease the damage during film formation and the interface level concentration can be decreased.

As means to obtain similar effect, silicon oxide film (chemical oxide), which is formed by oxidizing solution, typically, ozone solution may be also remained.

As well as Embodiment 1, the gate electrodes 243, 244, and capacitor electrode 245 are formed with the first conductive film 241 made of tantalum nitride (TaN) with a film thickness of from 10 to 50 nm and the second conductive film 242 made of tungsten (W) with a film thickness of from 100 to 400 nm.

Thereafter, as shown in FIG. 22(C), the first n-type impurity region 246, 248, and the first p-type impurity region 247 are formed by a doping treatment The impurity regions are formed so as to make superposition with the first conductive film 241 assuming the second conductive film 242 as a mask.

In FIG. 22(D), the sidewall spacers from 249 to 251 of gate electrode are formed with silicon oxide film. Silicon oxide film is formed entirely with plasma CVD method, and etched uniformly over the entire film with anisotropic dry etching to form a sidewall spacer. Assuming gate electrode as a mask, the second n-type impurity region 252, 254, and the second p-type impurity region 253 are formed.

Then, as shown in FIG. 23(A), the silicon oxynitride film 256 contained hydrogen is formed with a thickness of 50 nm by plasma CVD method. Furthermore, the silicon nitride film 257 manufactured by high-frequency magnetron sputtering method is formed. Thereafter, it is hydrogenated by a heat treatment under 410° C. and the hydrogen is prevented from diffusing within gas phases and can increase the effect of hydrogenation. In place of the silicon nitride film 257, aluminum oxynitride (AlNxOy: X=from 2.5 to 47.5 atom %) may also be applied. Besides the effect like silicon nitride film, the aluminum oxynitride can obtain effect that diffuse heat generation of TFT since its heat conductivity is high. Specifically, the integration level can be improved by making configuration of elements; therefore, the effect of heat generation can be decreased.

The interlayer insulating film 258 can be formed with silicon oxide film made by plasma CVD method, phosphorus glass (PSG), boron glass (BSG), or phosphorous boron glass (PBSG) made by atmospheric pressure CVD method, and most preferably, aperture of contact portion is formed at the same time as formation of coating film by photo organic resist such as polyimide and acryl.

Then, the wiring 259 is formed using Al, Ti, Mo, W, and the like. The silicon nitride film 260 is formed with a thickness of from 20 to 100 nm by high-frequency magnetron sputtering method in a way that the wiring 259 and the interlayer insulating film 258 are clad. This is set to be a barrier film that prevents the diffusion of Cu in forming the Cu wiring on the upper layer (FIG. 23(B)).

Then, the second interlayer insulating film 261 is formed with a thickness of from 0.5 to 5 μm using silicon oxide film or organic resin material. An opening to form wiring on the second interlayer insulating film 261 is formed, thereafter, the barrier layer 262 made of tantalum nitride film is formed with a thickness of from 100 to 200 nm with sputtering method over the entire surface. The tantalum nitride film is used as barrier layer that prevents diffusion of Cu. Furthermore, Cu film is formed by sputtering method to form seed layer, and the Cu layer 263 is formed with a thickness of from 1 to 10 μm by plating method, using copper sulfate. Besides plating, the Cu layer is formed with sputtering method and planarization can be also realized by reflowing under a heat treatment of 450° C. (FIG. 23(C)).

The Cu wiring 263 is conducted etching process to form the Cu layer 264. The Cu wiring is easily oxidized and thermally unstable; therefore, protective film which is clad to the Cu wiring is formed with a thickness of from 20 to 200 nm with silicon nitride film 265 by high frequency magnetron sputtering method. The silicon nitride film is cure, and oxidation of Cu and diffusion over periphery region can be prevented. In addition, by interposing the Cu wiring 264 between the silicon nitride film 260 and the silicon nitride film 265, TFT can be prevented from being contaminated. Furthermore, if necessary, the third interlayer insulating film 266 is formed, and multi-layered wiring is formed under the same operation as FIG. 23(C), and semiconductor device such as microprocessor and memory can be formed (FIG. 23(D)): Wiring layer can be subjected to multi-layered, if necessary.

Embodiment 6

In Embodiment 5, semiconductor device may be also completed by combining wiring forming step shown in Embodiment 4. Specifically, Cu wiring can be formed by damascene technique. In this case also, silicon nitride film on the present invention is applied.

Embodiment 7

One of embodiments of microcomputer is described using FIG. 18 and FIG. 19 as typical semiconductor device manufactured by Embodiment 1 to 6. As shown in FIG. 18, microcomputer can be realized by integrating each kind of functional circuit portion on the substrate such as glass or quartz with a thickness of from 0.3 to 1.1 mm. Each kind of functional circuit portion can be formed mainly composing TFT manufactured by Embodiments 1 to 6 and capacitor portion.

As component of microcomputer 2100, there are CPU 2101, ROM 2102, interrupt controller 2103, cash memory 2104, RAM 2105, DMAC 2106, clock occurrence circuit 2107, serial interface 2108, power source occurrence circuit 2109, ADC/DAC 2110, timer counter 2111, WDT 2112, and I/O port 2102, and the like.

The microcomputer 2100 formed on the glass substrate is firmly fixed by phase down bonding on base 2201 of ceramic and FRP (fiber reinforced plastic). On the back of the glass substrate of the microcomputer 2100, aluminum oxynitride 2203 with a good thermal conductivity is clad and heat dissipation effect is increased. Furthermore, heat radiation fin 2204 formed with aluminum contacting with the aluminum oxynitride is provided, and assumed as pyrogenic measure accompanying the operation of the microcomputer 2100. Entirely, it is covered with sealing resin 2205 and the connection with external circuit is conducted by pin 2202.

Embodiment of microcomputer was shown as an example in the present embodiment; however, semiconductor device with various function such as media processor, LSI for graphics, code LSI, memory, LSI for graphics, LSI for cellular phone, and the like can be completed by changing the structure and combination of functional circuit of each kind.

In accordance with the present invention, even at the glass substrate of strain point of 700° C. or less, the cure silicon nitride film containing hydrogen with the concentration of $1×10^{21}/cm^3$ or less and oxygen with the concentration of from $5×10^{18}$ to $5×10^{21}/cm^3$ having characteristic of having an etching rate of 10 nm/min or less with respect to the mixed solution (20° C.) containing an ammonium hydrogen fluoride ($NH_4HF_2$) of 7.13% and an ammonium fluoride ($NH_4F$) of 15.4% and a high blocking with respect to mobile ion like Li can be obtained.

In the silicon nitride film, semiconductor device is used as gate insulating film, protective film, especially barrier film of Cu wiring for each region of semiconductor device, thereby the semiconductor device that realizes high efficiency and high reliability can be provided.

By having hydrogen, oxygen content and etching characteristic as mentioned above, in the application into gate insulating film, gate leak current is decreased, electric field effect mobility, subthreshold coefficient, conductance (gm), and the like is in a good condition, and change in transistor characteristic in time in continuous operation is decreased; therefore, production yield and variation of characteristic can be improved. Furthermore, including the silicon nitride film between the crystalline semiconductor film and the silicon nitride film, the effect as described above can be shown up more effectively.

What is claimed is:

1. A semiconductor device comprising:
   a gate insulating film formed over an insulating substrate, the gate insulating film including a first silicon nitride film;
   a gate electrode over the gate insulating film;
   a second silicon nitride film over the gate electrode;
   a wiring formed over the second silicon nitride film, the wiring including copper; and
   a third silicon nitride film over the wiring,
   wherein each of the first silicon nitride film, the second silicon nitride film and the third silicon nitride film contains hydrogen with a concentration of $1 \times 10^{21}/cm^3$ or less and has a characteristic of an etching rate of 10 nm/min or less with respect to mixed solution at a temperature of 20° C., containing an ammonium hydrogen fluoride ($NH_4HF_2$) of 7.13% and an ammonium fluoride ($NH_4F$) of 15.4%.

2. The semiconductor device according to claim 1, wherein each of the first silicon nitride film, the second silicon nitride film and the third silicon nitride film contains oxygen with a concentration of from $5 \times 10^{18}$ to $5 \times 10^{21}/cm^3$.

3. The semiconductor device according to claim 1, wherein the insulating substrate is formed of a glass substrate with strain point of 700° C. or less.

4. A semiconductor device comprising:
   a gate insulating film of a field effect type transistor with channel length of from 0.35 to 2.5 μm, wherein the gate insulating film includes at least a first silicon nitride
   a gate electrode over the gate insulating film;
   a second silicon nitride film over the gate electrode;
   a wiring formed over the second silicon nitride film, the wiring including copper; and
   a third silicon nitride film over the wiring,
   wherein each of the first silicon nitride film, the second silicon nitride film and the third silicon nitride film contains hydrogen with a concentration of $1 \times 10^{21}/cm^3$ or less and has a characteristic of an etching rate of 10 nm/min or less with respect to mixed solution at a temperature of 20° C. containing an ammonium hydrogen fluoride ($NH_4HF_2$) of 7.13% and an ammonium fluoride ($NH_4F$) of 15.4%.

5. The semiconductor device according to claim 4, wherein each of the first silicon nitride film, the second silicon nitride film and the third silicon nitride film contains oxygen with a concentration of from $5 \times 10^{18}$ to $5 \times 10^{21}/cm^3$.

6. The semiconductor device according to claim 4, wherein the gate insulating film is formed over a crystalline silicon film that has a projection portion with radius of curvature 1 μm or less on the surface.

7. The semiconductor device according to claim 4, wherein an insulating substrate is formed of a glass substrate with strain point of 700° C. or less.

8. A semiconductor device comprising:
   a gate insulating film of a field effect type transistor with channel length of from 0.35 to 2.5 μm over an insulating substrate, wherein the gate insulating film includes a first silicon nitride film formed over a crystalline semiconductor film through a silicon oxide film,
   a gate electrode over the gate insulating film;
   a second silicon nitride film over the gate electrode;
   a wiring formed over the second silicon nitride film, the wiring including copper; and
   a third silicon nitride film over the wiring,
   wherein each of the first silicon nitride film, the second silicon nitride film and the third silicon nitride film contains hydrogen with a concentration of $1 \times 10^{21}/cm^3$ or less and has a characteristic of having an etching rate of 10 nm/min or less with respect to mixed solution at a temperature of 20° C. containing an ammonium hydrogen fluoride ($NH_4HF_2$) of 7.13% and an ammonium fluoride ($NH_4F$) of 15.4%.

9. The semiconductor device according to claim 8, wherein each of the first silicon nitride film, the second silicon nitride film and the third silicon nitride film, the second silicon nitride film and the third silicon nitride film each contains oxygen with a concentration of from $5 \times 10^{18}$ to $5 \times 10^{21}/cm^3$.

10. The semiconductor device according to claim 8, wherein the gate insulating film is formed over a crystalline silicon film that has a projection portion with radius of curvature 1 μm or less on the surface.

11. The semiconductor device according to claim 8, wherein the insulating substrate is formed of a glass substrate with strain point of 700° C. or less.

* * * * *

UNITED STATES PATENT AND TRADEMARK OFFICE
CERTIFICATE OF CORRECTION

| | | |
|---|---|---|
| PATENT NO. | : 7,893,439 B2 | Page 1 of 1 |
| APPLICATION NO. | : 12/003984 | |
| DATED | : February 22, 2011 | |
| INVENTOR(S) | : Toru Takayama et al. | |

It is certified that error appears in the above-identified patent and that said Letters Patent is hereby corrected as shown below:

At column 11, line 58, "duster of silicon" should be -- cluster of silicon --.

Signed and Sealed this
Second Day of August, 2011

David J. Kappos
*Director of the United States Patent and Trademark Office*